(12) United States Patent
Takashima et al.

(10) Patent No.: US 11,282,850 B2
(45) Date of Patent: Mar. 22, 2022

(54) SEMICONDUCTOR MEMORY DEVICE HAVING A CHARGE ACCUMULATING LAYER INCLUDING ALUMINUM, OXYGEN, AND NITROGEN

(71) Applicant: KIOXIA CORPORATION, Minato-ku (JP)

(72) Inventors: Akira Takashima, Fuchu (JP); Tsunehiro Ino, Fujisawa (JP); Ayaka Suko, Yokohama (JP)

(73) Assignee: KIOXIA CORPORATION, Minato-ku (JP)

( * ) Notice: Subject to any disclaimer, the term of this patent is extended or adjusted under 35 U.S.C. 154(b) by 75 days.

(21) Appl. No.: 16/564,032

(22) Filed: Sep. 9, 2019

(65) Prior Publication Data

US 2020/0303382 A1    Sep. 24, 2020

(30) Foreign Application Priority Data

Mar. 22, 2019    (JP) .............................. JP2019-054582

(51) Int. Cl.
*H01L 27/1157* (2017.01)
*H01L 27/11524* (2017.01)
*H01L 23/48* (2006.01)

(52) U.S. Cl.
CPC ........ *H01L 27/1157* (2013.01); *H01L 23/481* (2013.01); *H01L 27/11524* (2013.01)

(58) Field of Classification Search
CPC ......... H01L 27/11524; H01L 27/11565; H01L 29/40117; H01L 27/1157–11597
See application file for complete search history.

(56) References Cited

U.S. PATENT DOCUMENTS

| | | | |
|---|---|---|---|
| 9,490,140 B2 | 11/2016 | Go et al. | |
| 9,847,342 B2* | 12/2017 | Nagashima | ......... H01L 29/0649 |
| 10,103,155 B2* | 10/2018 | Sakaike | ............ H01L 27/11519 |
| 10,103,165 B2 | 10/2018 | Son et al. | |
| 10,153,164 B2 | 12/2018 | Nakao et al. | |
| 10,937,802 B2* | 3/2021 | Carlson | ............. H01L 27/11582 |

(Continued)

FOREIGN PATENT DOCUMENTS

JP    2016-171243 A    9/2016

*Primary Examiner* — Allen L Parker
*Assistant Examiner* — Gustavo G Ramallo
(74) *Attorney, Agent, or Firm* — Oblon, McClelland, Maier & Neustadt, L.L.P.

(57) ABSTRACT

A semiconductor memory device includes: a first and a second electrodes aligned in a first direction; a first semiconductor layer provided between the first and the second electrodes; a second semiconductor layer provided between the first semiconductor layer and the second electrode; a first charge accumulating layer provided between the first electrode and the first semiconductor layer; and a second charge accumulating layer provided between the second electrode and the second semiconductor layer. At least one of the first and the second charge accumulating layers include: a first and a second regions including nitrogen, aluminum, and oxygen and having different positions in a second direction; and a third region provided between the first and the second regions in the second direction. Oxygen is not included in the third region or a concentration of oxygen in the third region is lower than that in the first and the second regions.

14 Claims, 19 Drawing Sheets

(56) References Cited

U.S. PATENT DOCUMENTS

| | | | |
|---|---|---|---|
| 2009/0134450 A1 | 5/2009 | Kim et al. | |
| 2012/0052673 A1* | 3/2012 | Yoo | H01L 27/11582 438/591 |
| 2013/0307053 A1* | 11/2013 | Polishchuk | B82Y 10/00 257/325 |
| 2015/0060993 A1 | 3/2015 | Lee et al. | |
| 2016/0071876 A1* | 3/2016 | Mizuno | H01L 27/11582 365/185.17 |
| 2016/0268304 A1 | 9/2016 | Ikeda et al. | |
| 2017/0148517 A1* | 5/2017 | Harari | G11C 16/0491 |
| 2017/0263619 A1* | 9/2017 | Nagashima | H01L 27/11519 |
| 2018/0097011 A1* | 4/2018 | Sakata | H01L 29/40117 |
| 2018/0182776 A1* | 6/2018 | Kim | H01L 29/518 |
| 2020/0194451 A1* | 6/2020 | Lee | H01L 27/11582 |

\* cited by examiner

SEMICONDUCTOR MEMORY DEVICE HAVING A CHARGE ACCUMULATING LAYER INCLUDING ALUMINUM, OXYGEN, AND NITROGEN

CROSS-REFERENCE TO RELATED APPLICATIONS

This application is based upon and claims the benefit of Japanese Patent Application No. 2019-054582, filed on Mar. 22, 2019, the entire contents of which are incorporated herein by reference.

Field

Embodiments described below relate to a semiconductor memory device.

BACKGROUND

Description of the Related Art

There is known a semiconductor memory device that includes: a substrate; a plurality of gate electrodes laminated in a direction intersecting a surface of this substrate; a semiconductor layer facing these plurality of gate electrodes; and a gate insulating layer provided between the gate electrodes and the semiconductor layer. The gate insulating layer includes a memory section capable of storing data, such as a silicon nitride ($Si_3N_4$) layer or a floating gate, for example.

DETAILED DESCRIPTION

Figure 1:
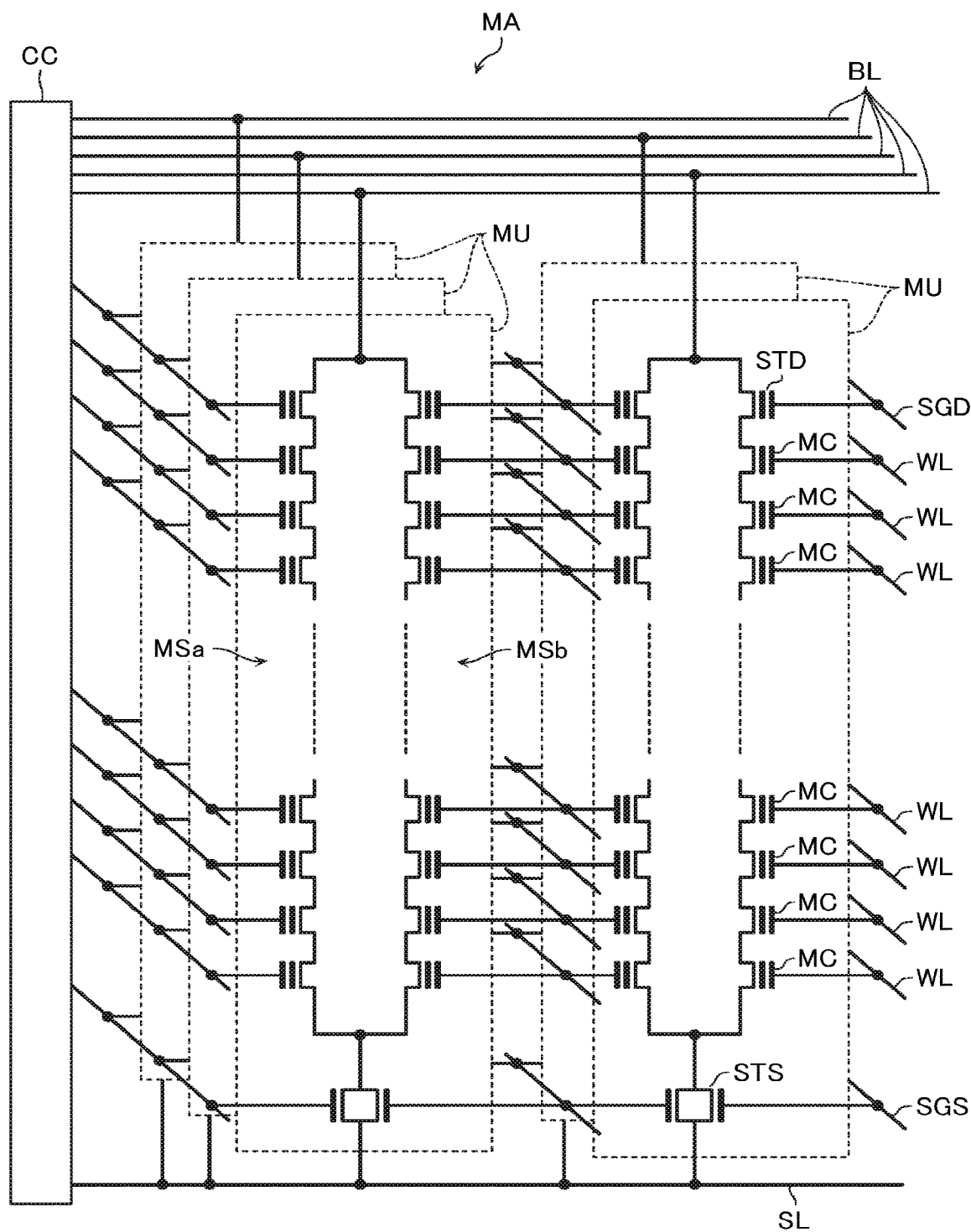
FIG. 1 is a schematic equivalent circuit diagram of a semiconductor memory device according to a first embodiment.

A semiconductor memory device according to an embodiment includes: a first electrode and a second electrode aligned in a first direction; a first semiconductor layer provided between the first electrode and the second electrode, the first semiconductor layer facing the first electrode; a second semiconductor layer provided between the first semiconductor layer and the second electrode, the second semiconductor layer facing the second electrode; a first charge accumulating layer provided between the first electrode and the first semiconductor layer, the first charge accumulating layer including nitrogen and aluminum; and a second charge accumulating layer provided between the second electrode and the second semiconductor layer, the second charge accumulating layer including nitrogen and aluminum. At least one of the first charge accumulating layer and the second charge accumulating layer includes: a first region including oxygen in addition to nitrogen and aluminum and having a first position as a position in a second direction, the second direction intersecting the first direction; a second region including oxygen in addition to nitrogen and aluminum and having a second position as a position in the second direction, the second position being different from the first position; and a third region having a third position as a position in the second direction, the third position being between the first position and the second position. Oxygen is not included in the third region or a concentration of oxygen in the third region is lower than concentrations of oxygen in the first region and the second region.

Next, semiconductor memory devices according to embodiments will be described in detail with reference to the drawings. Note that these embodiments are merely examples, and are not shown with the intention of limiting the present invention.

Moreover, the drawings are each schematic, and part of a configuration, and so on, of the drawings is sometimes omitted. Moreover, portions that are common to each of the embodiments are assigned with common symbols, and descriptions thereof are sometimes omitted.

Moreover, in the present specification, a certain direction parallel to a surface of a substrate will be called an X direction, a direction parallel to the surface of the substrate and perpendicular to the X direction will be called a Y direction, and a direction perpendicular to the surface of the substrate will be called a Z direction.

Moreover, in the present specification, sometimes, a direction along a certain plane will be called a first direction, a direction intersecting the first direction along this certain plane will be called a second direction, and a direction intersecting this certain plane will be called a third direction. These first direction, second direction, and third direction may, but need not, each respectively correspond to any one of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end section on a substrate side of this configuration, and when an upper surface or an upper end is referred to for a certain configuration, this will be assumed to mean a surface or end section on an opposite side to the substrate of this configuration. Moreover, a surface intersecting the X direction or the Y direction will be called a side surface, and so on.

Moreover, in the present specification, when a "length" or a "thickness" in a certain direction is referred to for a configuration, a member, and so on, this will sometimes mean a length or a thickness in a cross section observed by the likes of SEM (Scanning Electron Microscopy) or TEM (Transmission Electron Microscopy), and so on.

Moreover, in the present specification, a "distance" between two configurations will mean the shortest distance in the observed cross section, not the distance between the center of gravity or center position of two configurations.

First Embodiment

[Configuration]

FIG. 1 is a schematic equivalent circuit diagram of a semiconductor memory device according to a first embodiment.

The semiconductor memory device according to the present embodiment includes: a memory cell array MA; and a control circuit CC that controls the memory cell array MA.

The memory cell array MA includes a plurality of memory units MU. These plurality of memory units MU each include two electrically independent memory strings MSa, MSb. One ends of these memory strings MSa, MSb are respectively connected to drain select transistor STD, and are connected to a common bit line BL via this drain select transistor STD. The other ends of the memory strings MSa, MSb are connected to a common source select transistor STS, and are connected to a common source line SL via this source select transistor STS.

The memory strings MSa, MSb each include a plurality of memory cells MC connected in series. The memory cell MC is a field effect type of transistor that includes: a semiconductor layer; a gate insulating layer; and a gate electrode. The semiconductor layer functions as a channel region. The gate insulating layer includes a charge accumulating layer capable of storing data. A threshold voltage of the memory cell MC changes according to an amount of charge in the charge accumulating layer. The gate electrode is part of a word line WL.

The select transistors (STD, STS) are each a field effect type of transistor that includes: a semiconductor layer; a gate insulating layer; and a gate electrode. The semiconductor layer functions as a channel region. The gate electrode of the drain select transistor STD is part of a drain select gate line SGD. The gate electrode of the source select transistor STS is part of a source select gate line SGS.

The control circuit CC generates a voltage required in a read operation, a write operation, and an erase operation, and applies the generated voltage to the bit line BL, the source line SL, the word line WL, and the select gate lines (SGD, SGS), for example. The control circuit CC includes a plurality of transistors and wirings provided on the same chip as the memory cell array MA, for example. Note that the control circuit CC may include another chip such as a controller chip controlling a memory chip including the memory cell array MA, for example.

Next, a schematic configuration example of the semiconductor memory device according to the present embodiment will be described with reference to FIGS. 2 and 3.

The semiconductor memory device according to the present embodiment includes: a substrate 110; and the memory cell array MA provided above the substrate 110. Moreover, the memory cell array MA includes a plurality of laminated body structures LS arranged in the Y direction via trenches AT. The laminated body structure LS includes a plurality of conductive layers 120 laminated in the Z direction. Moreover, the memory cell array MA includes a plurality of memory holes MH aligned in the X direction along each of the trenches AT. There are provided in each of the memory holes MH: a semiconductor section 130 extending in the Z direction; gate insulating layers 140a, 140b provided between the laminated body structures LS and the semiconductor section 130; and an insulating layer 150 of the likes of silicon oxide ($SiO_2$), provided between the semiconductor section 130 and the trench AT. An insulating layer 151 of the likes of silicon oxide ($SiO_2$) is embedded in the trench AT. Moreover, a wiring layer 160 is connected to a lower end of the semiconductor section 130.

The substrate 110 is a semiconductor substrate of the likes of single crystal silicon (Si), for example. The substrate 110 has a double well structure where, for example, an n type impurity layer is included in an upper surface of the semiconductor substrate, and a p type impurity layer is further included in this n type impurity layer. Note that a surface of the substrate 110 may be provided with the likes of transistors or wirings configuring the control circuit CC, for example.

The conductive layer 120 is a substantially plate-like conductive layer extending in the X direction, and is a conductive layer of the likes of a laminated film of titanium nitride (TiN) and tungsten (W), or the likes of polycrystalline silicon (Si) implanted with an impurity, for example. These conductive layers 120 respectively function as the word lines WL and gate electrodes of the memory cells MC (FIG. 1), or as the drain select gate lines SGD and gate electrodes of the drain select transistors STD (FIG. 1).

Below the plurality of conductive layers 120, a conductive layer 121 including a material similar to that of the conductive layer 120, for example, is provided. The conductive layer 121 functions as the source select gate line SGS and gate electrodes of the source select transistors STS (FIG. 1).

Between the plurality of conductive layers 120, between the lowermost layer conductive layer 120 and the conductive layer 121, and between the conductive layer 121 and the wiring layer 160, an insulating layer 122 of the likes of silicon oxide ($SiO_2$) is provided.

Hereafter, in the case of focusing on two laminated body structures LS adjacent in the Y direction, the plurality of conductive layers 120 included in one of the laminated body structures LS will sometimes be called first conductive layers 120a. Moreover, the plurality of conductive layers 120 included in the other of the laminated body structures LS will sometimes be called second conductive layers 120b.

The semiconductor section 130 includes: a first semiconductor layer 130a and a second semiconductor layer 130b that are aligned in the Y direction via the trench AT; and a semiconductor layer 133 connected to lower ends of these.

The first semiconductor layer 130a is a semiconductor layer of the likes of non-doped polycrystalline silicon (Si), for example. The first semiconductor layer 130a extends in the Z direction, and faces the plurality of first conductive layers 120a laminated in the Z direction. The first semiconductor layer 130a functions as channel regions of the plurality of memory cells MC and the drain select transistor STD included in the memory string MSa (FIG. 1).

The second semiconductor layer 130b is a semiconductor layer of the likes of non-doped polycrystalline silicon (Si), for example. The second semiconductor layer 130b extends in the Z direction, and faces the plurality of second conductive layers 120b laminated in the Z direction. The second semiconductor layer 130b functions as channel regions of the plurality of memory cells MC and the drain select transistor STD included in the memory string MSb (FIG. 1).

The semiconductor layer 133 faces two conductive layers 121 adjacent in the Y direction. The semiconductor layer 133 is a semiconductor layer of the likes of polycrystalline silicon (Si), and functions as a channel region of the source select transistor STS (FIG. 1). An insulating layer 135 of the likes of silicon oxide ($SiO_2$) is provided between the semiconductor layer 133 and the conductive layer 121.

The gate insulating layer 140a is provided between the first semiconductor layer 130a and the first conductive layer 120a. The gate insulating layer 140a includes: a first tunnel insulating layer 141a; a first charge accumulating layer 142a; and a first block insulating layer 143a. The first tunnel insulating layer 141a and the first block insulating layer 143a are insulating layers of the likes of silicon oxide ($SiO_2$), for example. The first charge accumulating layer 142a will be mentioned later.

The gate insulating layer 140b is provided between the second semiconductor layer 130b and the second conductive layer 120b. The gate insulating layer 140b includes: a second tunnel insulating layer 141b; a second charge accumulating layer 142b; and a second block insulating layer 143b. The second tunnel insulating layer 141b and the second block insulating layer 143b are insulating layers of the likes of silicon oxide ($SiO_2$), for example. The second charge accumulating layer 142b will be mentioned later.

The wiring layer 160 is a plate-like conductive layer extending in the X direction and the Y direction. The wiring layer 160 is a conductive layer of the likes of polycrystalline silicon (Si) implanted with an impurity, for example, and functions as the source line SL (FIG. 1). Note that a structure of the source line SL may be appropriately changed. For example, the source line SL may be part of the surface of the substrate 110. Moreover, the source line SL may include a metal layer of the likes of titanium nitride (TiN) and tungsten (W). Moreover, the source line SL may be connected to a lower end of the semiconductor section 130, or may be connected to a side surface in the Y direction of the semiconductor section 130.

Figure 2:
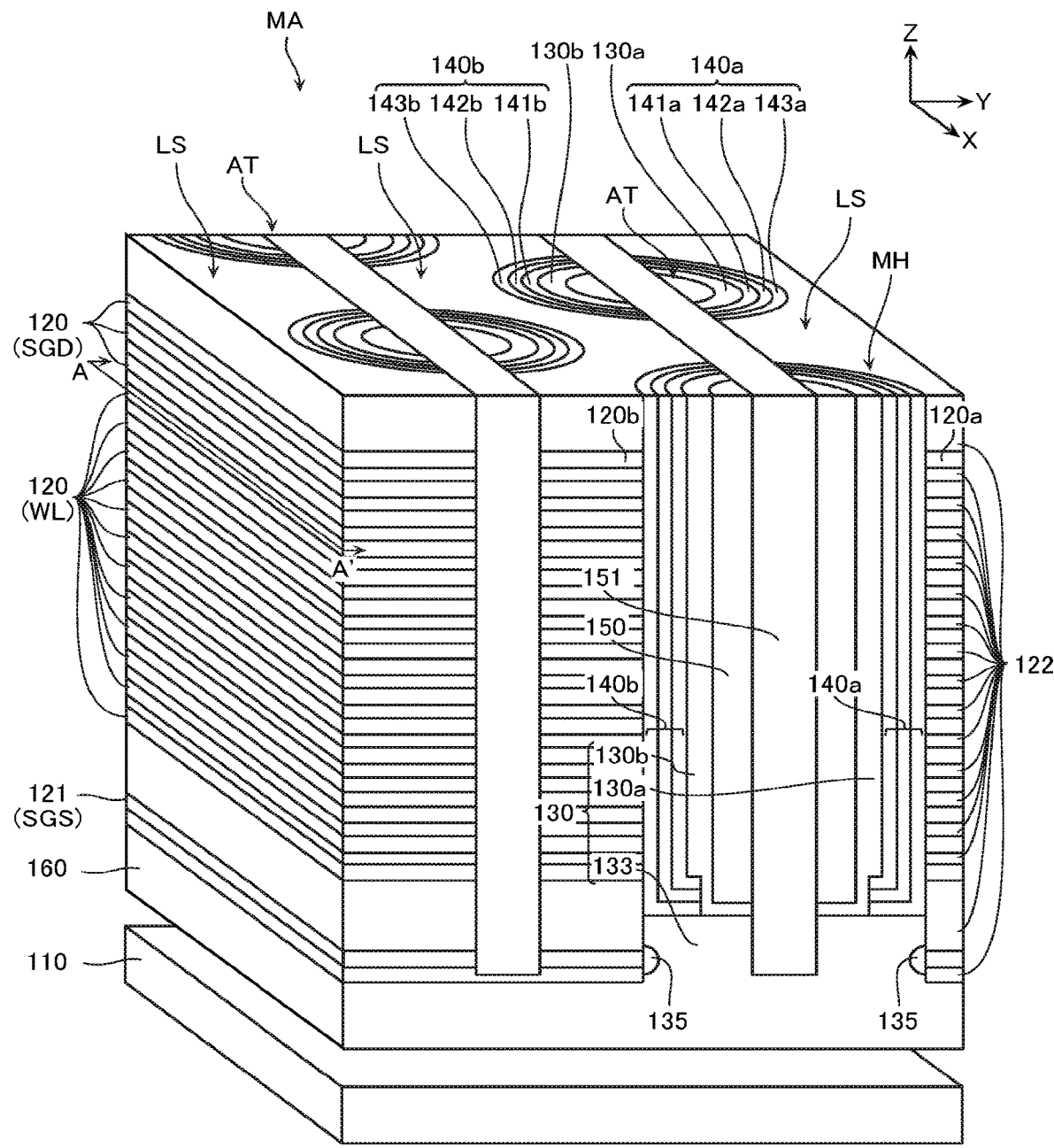
FIG. 2 is a schematic perspective view of same semiconductor memory device.
Figure 3:
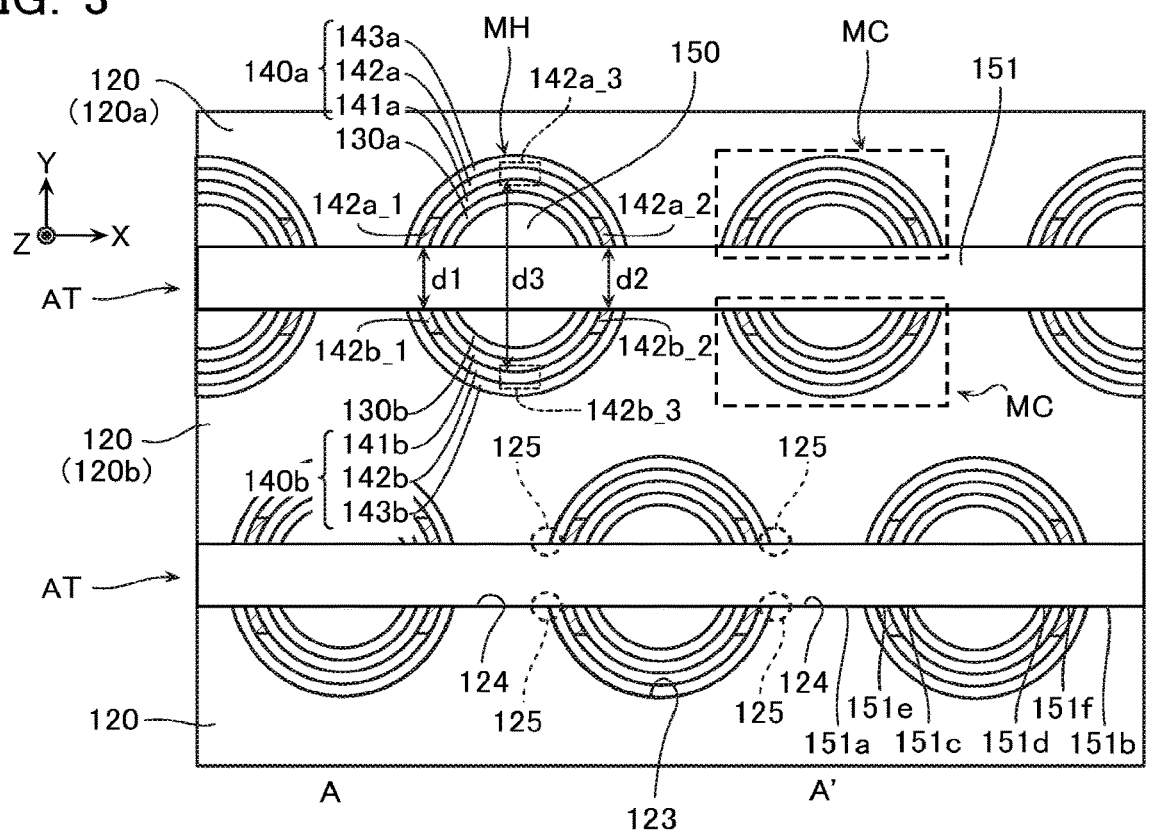
FIG. 3 is a schematic cross-sectional view corresponding to a cross section of the portion indicated by the line A-A' in FIG. 2.

FIG. 3 is an XY cross-sectional view in which the structure shown in FIG. 2 has been cut in the direction of the arrows along the line A-A' and viewed in −Z direction.

As mentioned above, the semiconductor memory device according to the present embodiment includes pluralities of the conductive layers 120 arranged in the Y direction via the trenches AT. Moreover, the semiconductor memory device includes the substantially circular memory holes MH arranged in the X direction along each trench AT. Each of the memory holes MH is provided with the first semiconductor layer 130a, the first tunnel insulating layer 141a, the first charge accumulating layer 142a, and the first block insulating layer 143a that are provided between the trench AT and the first conductive layers 120a. Moreover, each of the memory holes MH is provided with the second semiconductor layer 130b, the second tunnel insulating layer 141b, the second charge accumulating layer 142b, and the second block insulating layer 143b that are provided between the trench AT and the second conductive layers 120b.

Now, the conductive layers 120 includes facing surfaces 123 facing the first semiconductor layer 130a and the second semiconductor layer 130b. The facing surfaces 123 are formed concavely following a shape of the memory hole MH. On the other hand, the conductive layers 120 includes contacting surfaces 124 contacting the insulating layer 151 (portions of the conductive layers 120 provided between two memory holes MH aligned in the X direction). The contacting surfaces 124 are formed linearly following a shape of the trench AT. Moreover, connecting portions of the facing surfaces 123 and the contacting surfaces 124 are provided with corners 125.

Moreover, the first semiconductor layer 130a, the second semiconductor layer 130b, and the gate insulating layers 140a, 140b each includes facing surfaces facing the facing surface 123 of the conductive layer 120. These facing surfaces are formed convexly following the shape of the memory hole MH. On the other hand, the first semiconductor layer 130a, the second semiconductor layer 130b, and the gate insulating layers 140a, 140b each includes contacting surfaces contacting the insulating layer 151. These contacting surfaces are formed linearly following a shape of the trench AT. Moreover, connecting portions of the facing surfaces and the contacting surfaces are provided with corners.

Moreover, the first charge accumulating layer 142a of the gate insulating layer 140a according to the present embodiment includes: a first region 142a_1 provided at one end in the X direction; a second region 142a_2 provided at the other end in the X direction; and a third region 142a_3 provided between these in the X direction. The first region 142a_1 and the second region 142a_2 have different positions in the X direction from each other and contact the insulating layer 151. The first region 142a_1 and the second region 142a_2 are provided between the corners 125 of the conductive layer 120 and the corners of the first semiconductor layer 130a, respectively. The third region 142a_3 has a position in the X direction between the position in the X direction of the first region 142a_1 and the position in the X direction of the second region 142a_2. The first region 142a_1 and the second region 142a_2 include oxygen (O) and aluminum (Al), for example. For example, the first region 142a_1 and the second region 142a_2 include the likes of aluminum oxide (AlO), aluminum oxynitride (AlON), aluminum silicon oxide (AlSiO), or aluminum silicon oxynitride (AlSiON). The third region 142a_3 includes nitrogen (N) and aluminum (Al). For example, the third region 142a_3 includes the likes of aluminum nitride (AlN) or aluminum silicon nitride (AlSiN). Concentrations of oxygen in the first region 142a_1 and the second region 142a_2 are higher than a concentration of oxygen in the third region 142a_3. The third region 142a_3 may, but need not, include oxygen. Note that range of the first region 142a_1, the second region 142a_2, and the third region 142a_3 in the first charge accumulating layer 142a can be freely determined.

Moreover, the second charge accumulating layer 142b of the gate insulating layer 140b according to the present embodiment includes: a first region 142b_1 provided at one end in the X direction; a second region 142b_2 provided at the other end in the X direction; and a third region 142b_3 provided between these in the X direction. The first region 142b_1 and the second region 142b_2 have different positions in the X direction from each other and contact the insulating layer 151. The first region 142b_1 and the second region 142b_2 are provided between the corners 125 of the conductive layer 120 and the corners of the second semiconductor layer 130b, respectively. The third region 142b_3 has a position in the X direction between the position in the X direction of the first region 142b_1 and the position in the X direction of the second region 142b_2. The first region 142b_1 and the second region 142b_2 include oxygen (O) and aluminum (Al). For example, the first region 142b_1 and the second region 142b_2 include the likes of aluminum oxide (AlO), aluminum oxynitride (AlON), aluminum silicon oxide (AlSiO), or aluminum silicon oxynitride (AlSiON). The third region 142b_3 includes nitrogen (N) and aluminum (Al). For example, the third region 142b_3 includes the likes of aluminum nitride (AlN) or aluminum silicon nitride (AlSiN). Concentrations of oxygen in the first region 142b_1 and the second region 142b_2 are higher than a concentration of oxygen in the third region 142b_3. The third region 142b_3 may, but need not, include oxygen. Note that range of the first region 142b_1, the second region 142b_2, and the third region 142b_3 in the second charge accumulating layer 142b can be freely determined.

Note that in FIG. 3, a distance in the Y direction between the first region 142a_1 of the first charge accumulation layer 142a and the first region 142b_1 of the second charge accumulation layer 142b is shown as a distance d1. Additionally, a distance in the Y direction between the second region 142a_2 of the first charge accumulation layer 142a and the second region 142b_2 of the second charge accumulation layer 142b is shown as a distance d2. Moreover, a distance in the Y direction between the third region 142a_3 of the first charge accumulation layer 142a and the third region 142b_3 of the second charge accumulation layer 142b is shown as a distance d3. In the illustrated example, the distance d1 and the distance d2 are substantially the same. On the other hand, the distance d3 is larger than the distances d1 and d2.

Additionally, aside surface of the insulating layer 151 according to the embodiment includes: a section 151a and a section 151b separated in the X direction from each other and contacting the conductive layer 120; a section 151c and a section 151d provided between the sections 151a, 151b and contacting the first semiconductor layer 130a or the second semiconductor layer 130b; a section 151e provided between the section 151a and the section 151c and contacting the first region 142a_1 of the first charge accumulation layer 142a or the first region 142b_1 of the second charge accumulation layer 142b; and a section 151f provided between the section 151b and the section 151d and contacting the second region 142a_2 of the first charge accumulation layer 142a or the second region 142b_2 of the second charge accumulation layer 142b.

[Manufacturing Method]

Next, a manufacturing method of the semiconductor memory device according to the present embodiment will be described with reference to FIGS. 4-16.

Figure 4:
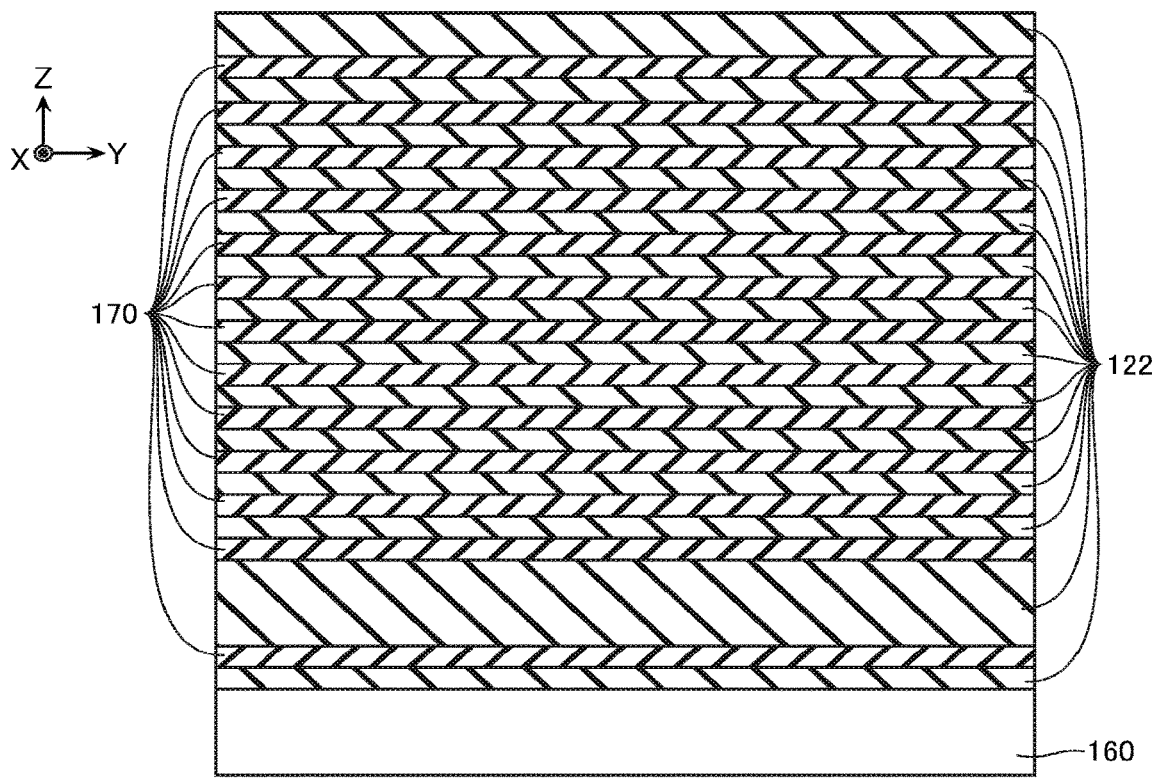
FIG. 4 is a schematic cross-sectional view showing a manufacturing method of the semiconductor memory device according to the first embodiment.

As shown in FIG. 4, in same manufacturing method, the wiring layer 160 is formed above an unillustrated substrate. In addition, a plurality of the insulating layers 122 and sacrifice layers 170 are alternately laminated on an upper surface of the wiring layer 160. The sacrifice layer 170 is configured from the likes of silicon nitride ($Si_3N_4$), for example. Deposition of the wiring layer 160, the insulating layers 122, and the sacrifice layers 170 is performed by the likes of CVD (Chemical Vapor Deposition), for example.

Figure 5:
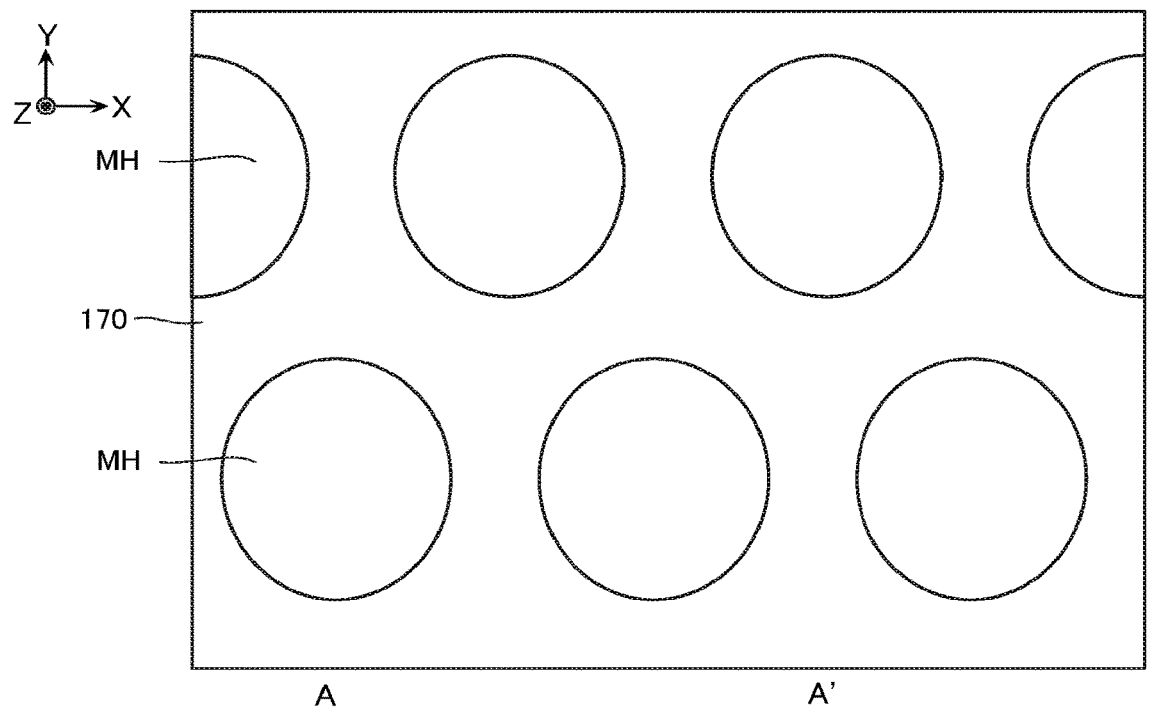
FIG. 5 is a schematic plan view showing same manufacturing method.
Figure 6:
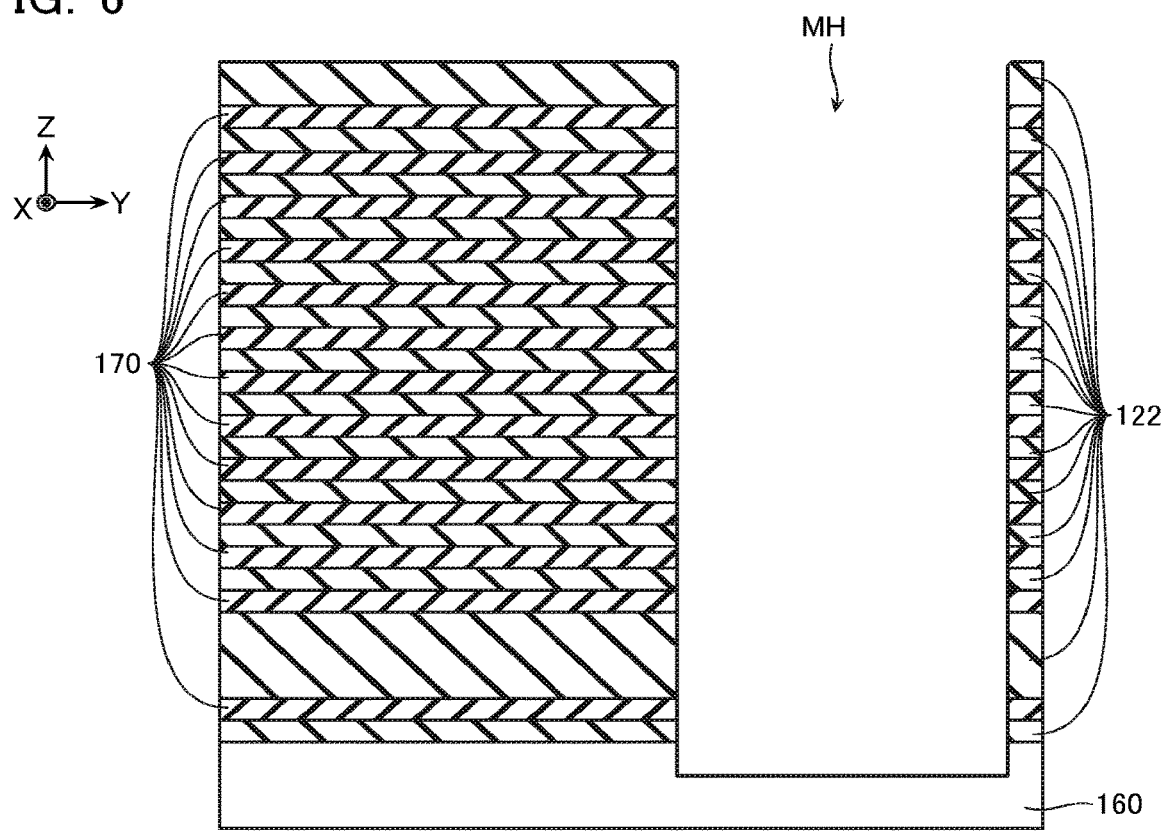
FIG. 6 is a schematic cross-sectional view showing same manufacturing method.

Next, as shown in FIG. 5 (an XY cross-sectional view corresponding to a cross section of the portion indicated by the line A-A' in FIG. 2) and FIG. 6, the memory holes MH are formed in the insulating layers 122 and the sacrifice layers 170. The memory holes MH are formed by, for example, forming on an upper surface of the structure shown in FIG. 4 an insulating layer having openings in portions corresponding to the memory holes MH, and performing the likes of RIE (Reactive Ion Etching: RIE) with this insulating layer as a mask. A shape in XY cross section of the memory hole MH may be substantially circular, or may be substantially oval, for example. As shown in FIG. 6, the memory hole MH extends in the Z direction and penetrates the plurality of insulating layers 122 and sacrifice layers 170 to expose the upper surface of the wiring layer 160.

Figure 7:
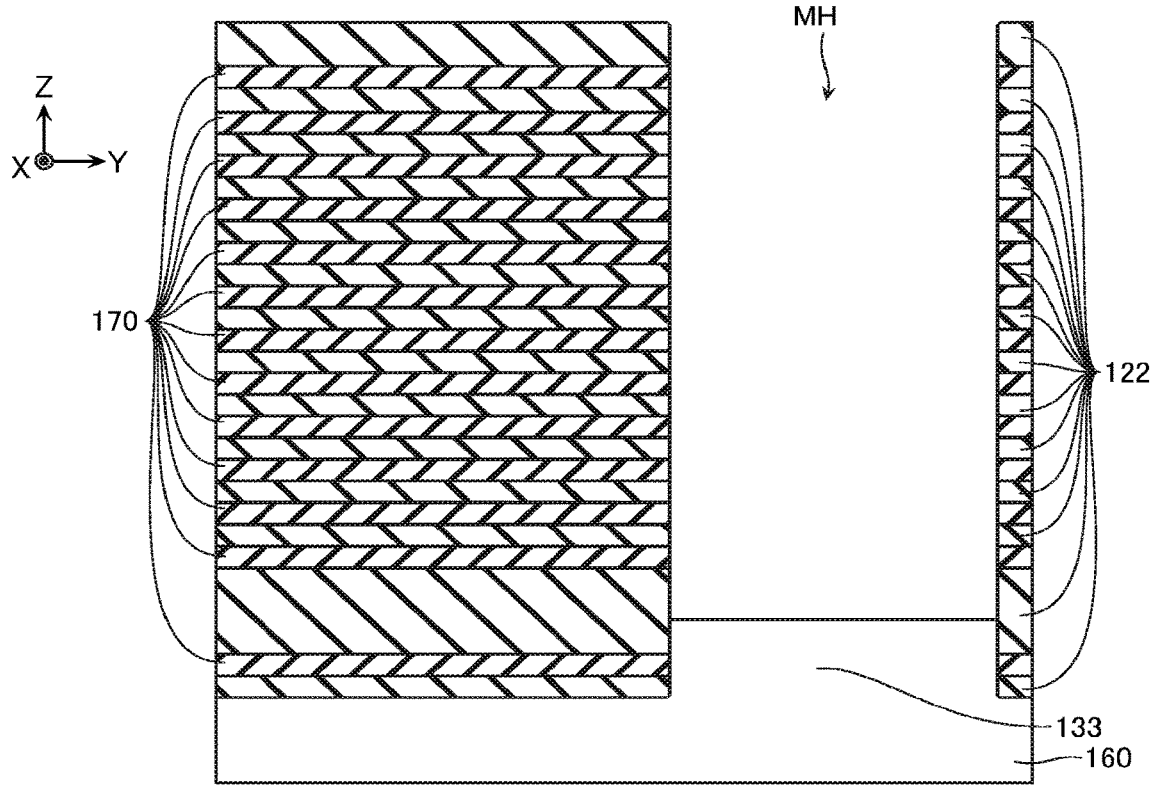
FIG. 7 is a schematic cross-sectional view showing same manufacturing method.

Next, as shown in FIG. 7, the semiconductor layer 133 is formed in a bottom section of the memory hole MH. The semiconductor layer 133 is formed by the likes of epitaxial growth, for example.

Figure 8:
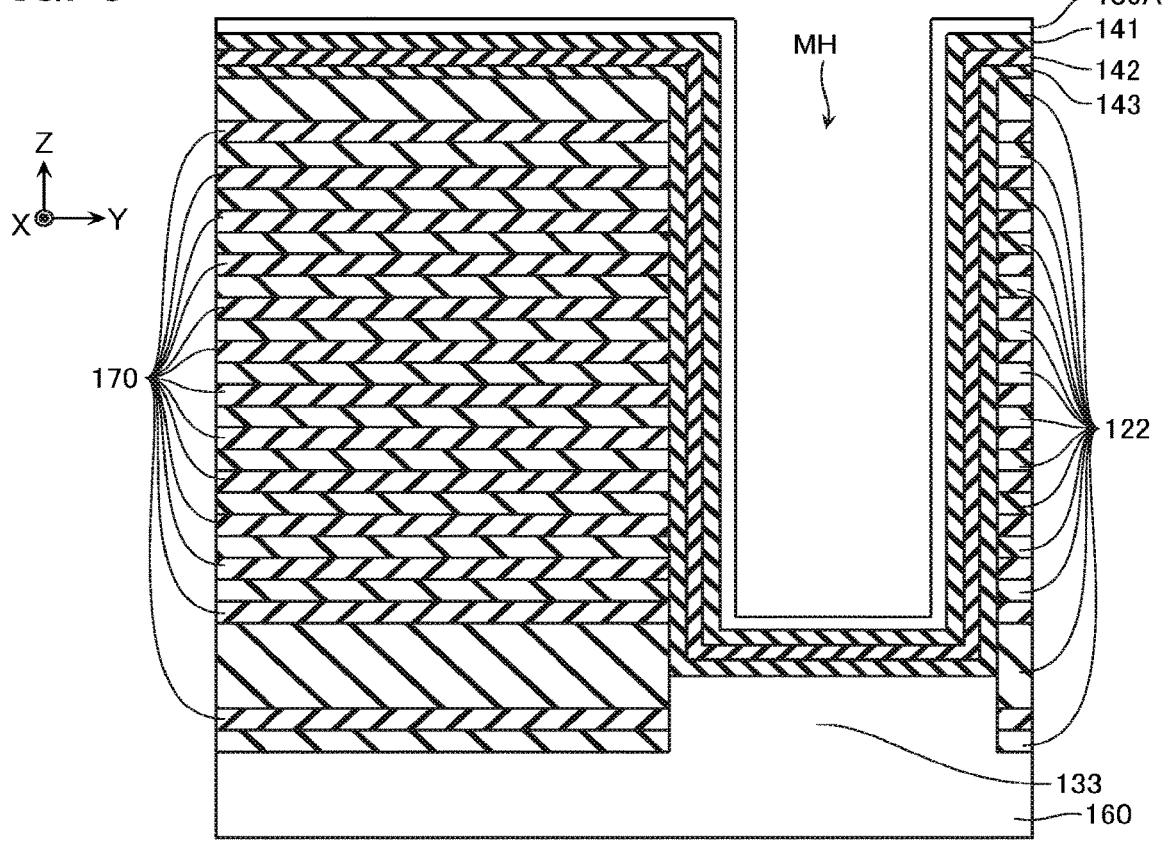
FIG. 8 is a schematic cross-sectional view showing same manufacturing method.

Next, as shown in FIG. 8, a block insulating layer 143, a charge accumulating layer 142, a tunnel insulating layer 141, and an amorphous silicon layer 130A are deposited on a bottom surface and a side surface of the memory hole MH. This step is performed by a method such as CVD, for example.

Figure 9:
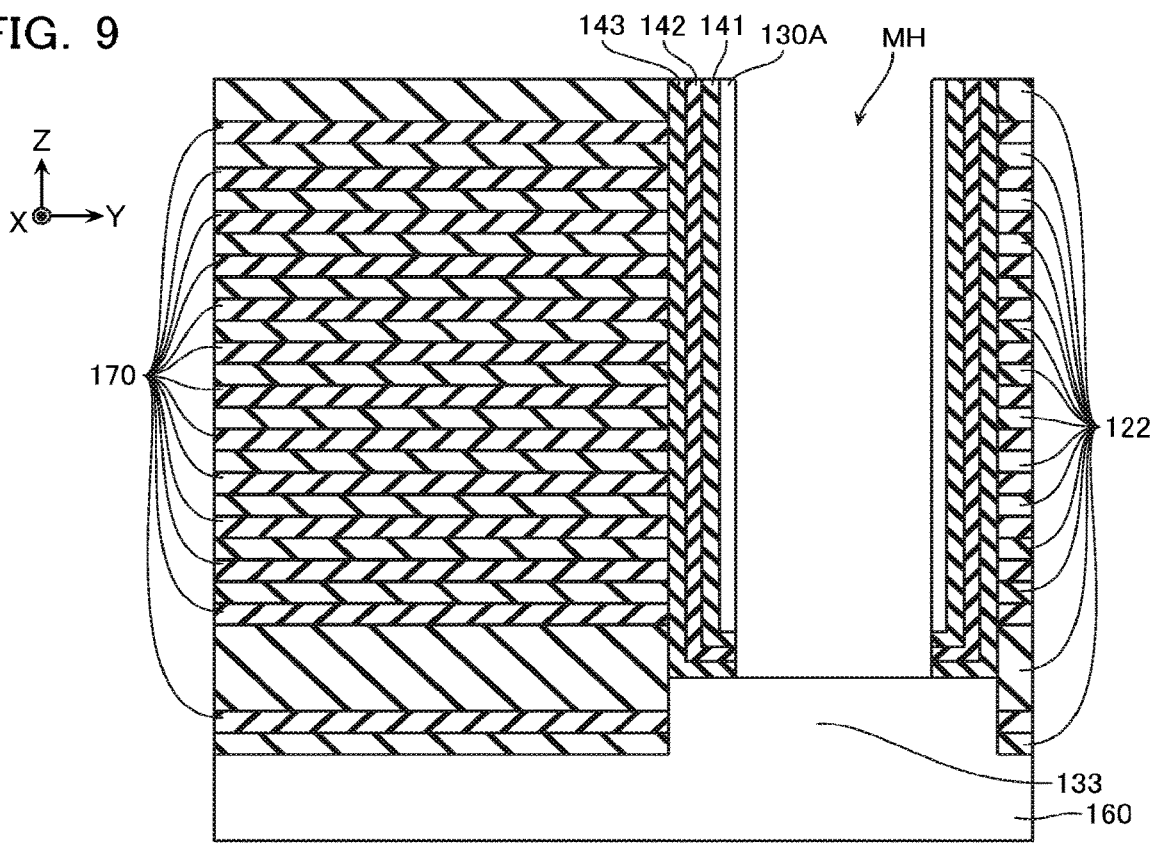
FIG. 9 is a schematic cross-sectional view showing same manufacturing method.

Next, as shown in FIG. 9, parts of the deposited films (143, 142, 141, 130A) are removed to expose an upper surface of the semiconductor layer 133 and an upper surface of the insulating layer 122. This step is performed by the likes of RIE, for example.

Figure 10:
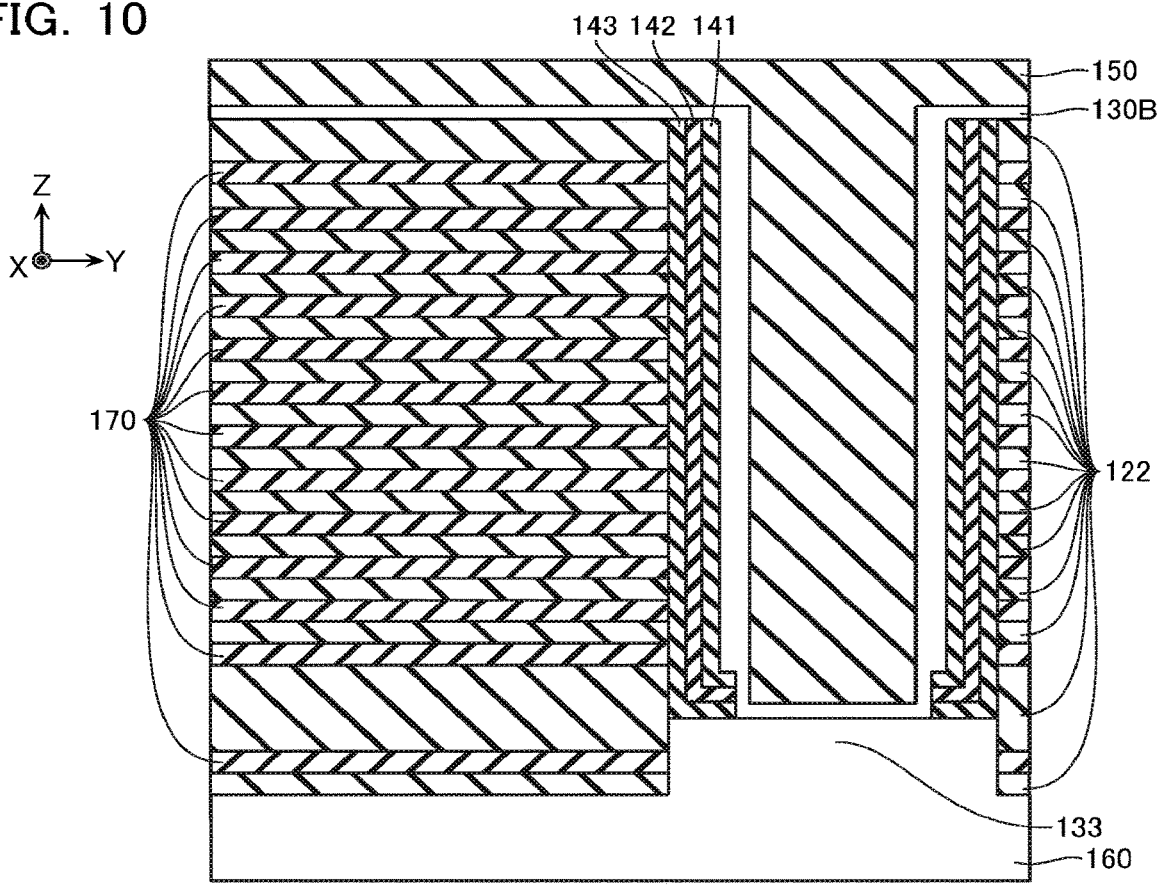
FIG. 10 is a schematic cross-sectional view showing same manufacturing method.

Next, as shown in FIG. 10, an amorphous silicon layer and the insulating layer 150 are deposited on an inside of the memory hole MH. In addition, heat treatment, and so on, is performed, and a crystal structure of the amorphous silicon layer is reformed to form a semiconductor layer 130B of the likes of polycrystalline silicon (Si).

Figure 11:
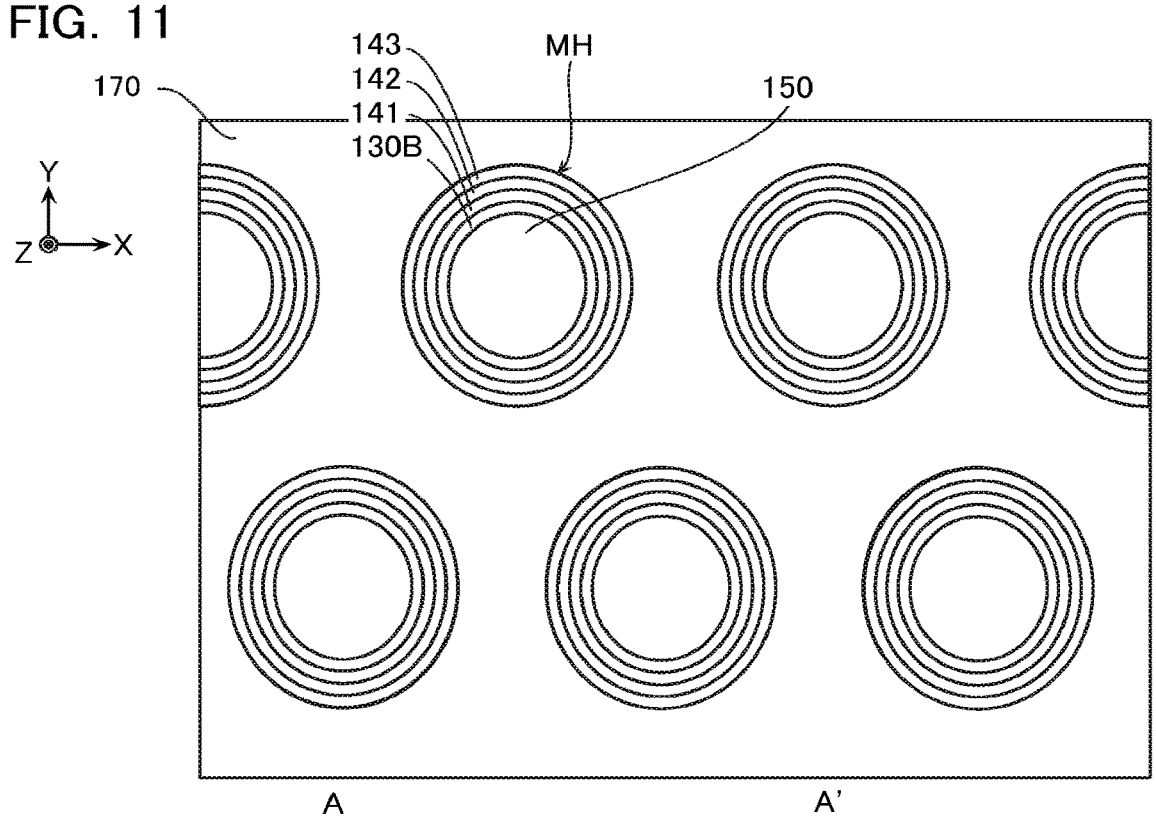
FIG. 11 is a schematic plan view showing same manufacturing method.
Figure 12:
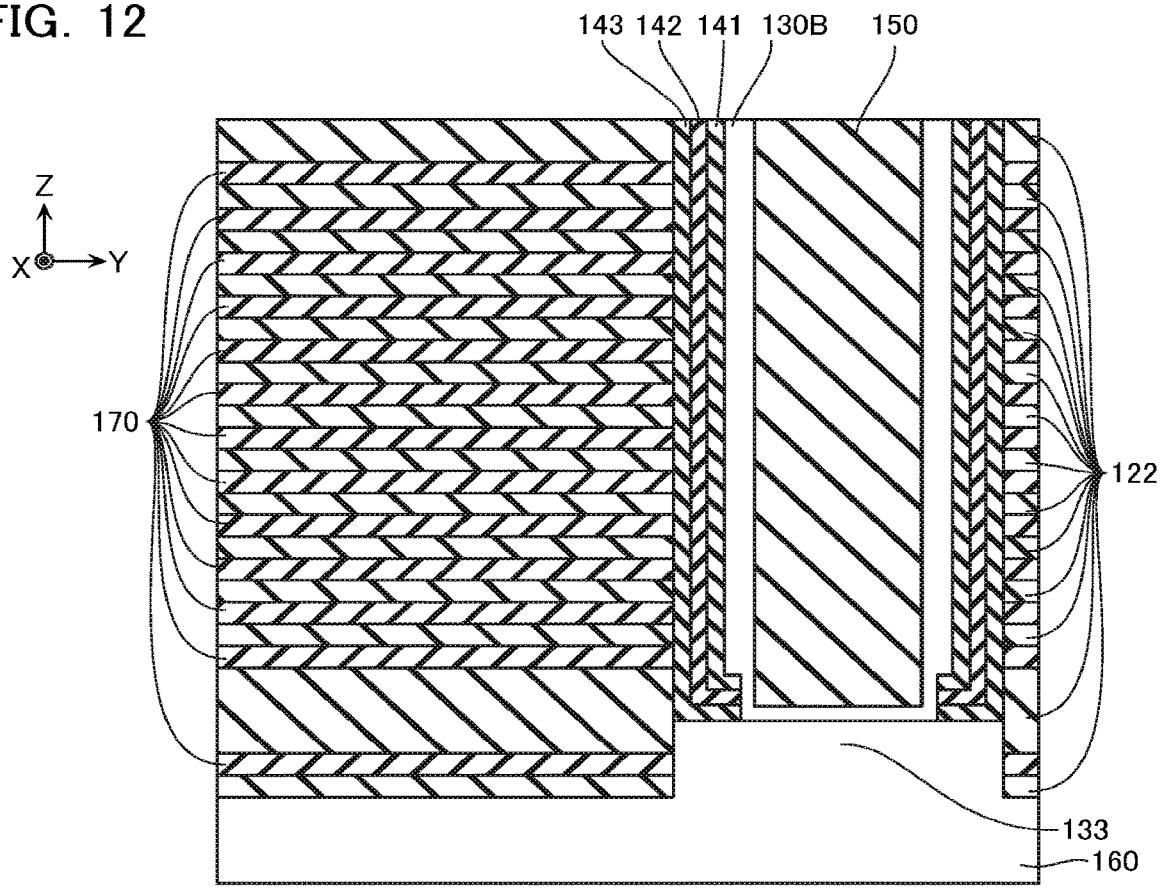
FIG. 12 is a schematic cross-sectional view showing same manufacturing method.

Next, as shown in FIGS. 11 and 12, upper sections of the insulating layer 150 and the semiconductor layer 130B are removed, and the upper surface of the insulating layer 122 is exposed to divide the semiconductor layer 130B into portions corresponding to the respective memory holes MH.

Figure 13:
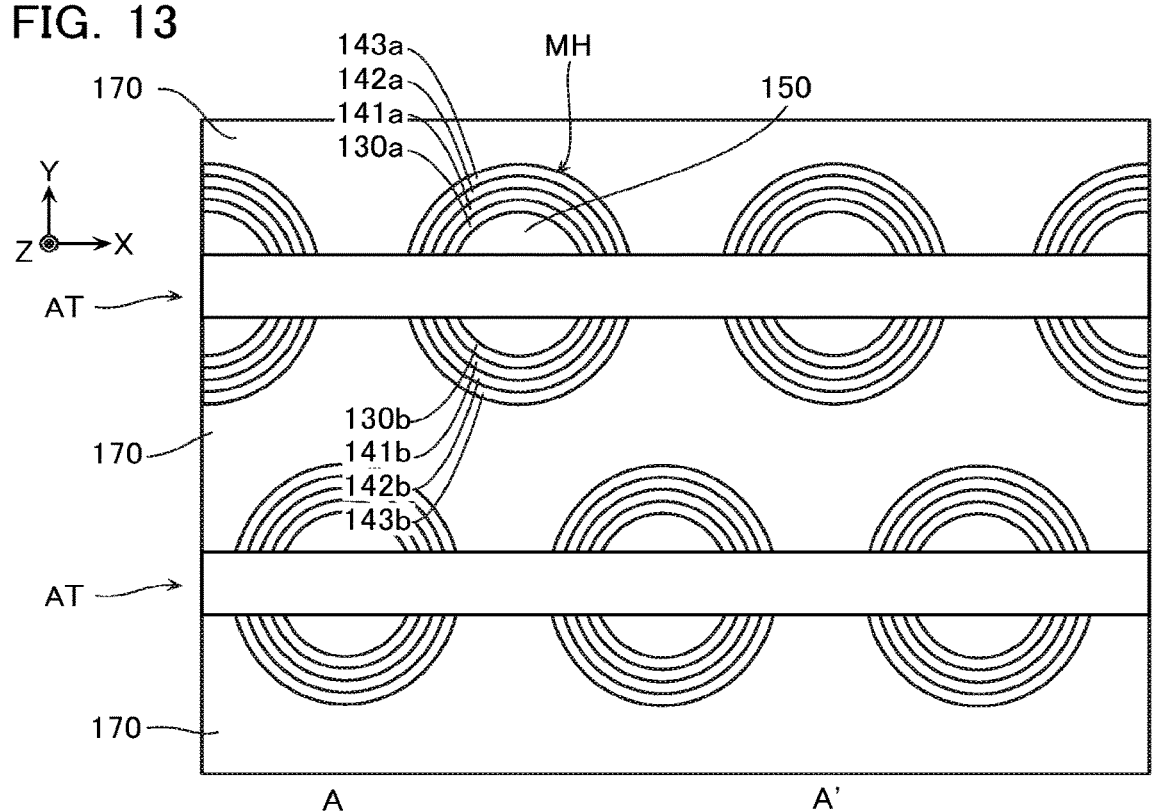
FIG. 13 is a schematic plan view showing same manufacturing method.
Figure 14:
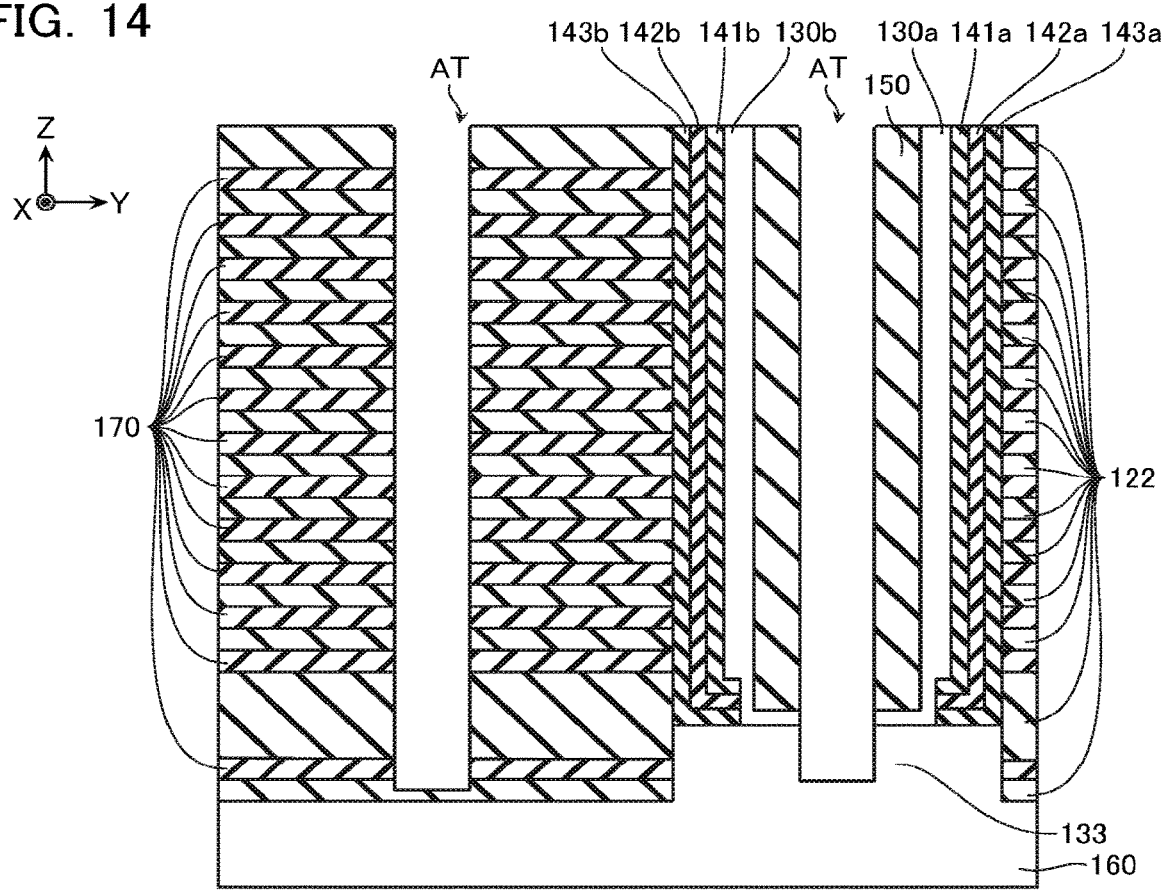
FIG. 14 is a schematic cross-sectional view showing same manufacturing method.

Next, as shown in FIGS. 13 and 14, the trenches AT are formed in the insulating layers 122 and the sacrifice layers 170. The trenches AT are formed by, for example, forming on an upper surface of the structure shown in FIG. 12 an insulating layer having openings in portions corresponding to the trenches AT, and performing the likes of RIE with this insulating layer as a mask. The trench AT extends in the X direction as shown in FIG. 13. As shown in FIG. 14, the trench AT extends in the Z direction, and penetrates the plurality of insulating layers 122 and sacrifice layers 170, and the layers (143, 142, 141, 130B, 150) in the memory hole MH to divide a configuration of these in the Y direction.

Due to this step, the first semiconductor layer 130a and the second semiconductor layer 130b, the first tunnel insulating layer 141a and the second tunnel insulating layer 141b, the first charge accumulating layer 142a and the second charge accumulating layer 142b, and the first block insulating layer 143a and the second block insulating layer 143b are formed.

Figure 15:
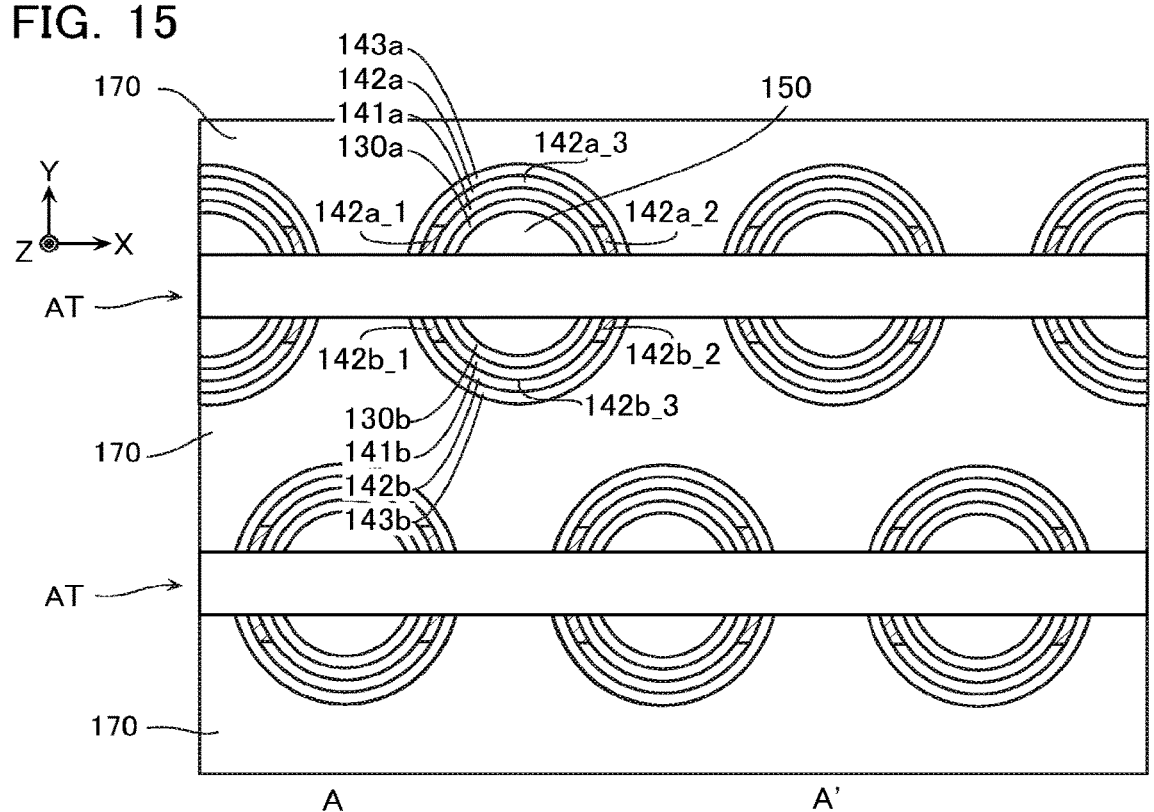
FIG. 15 is a schematic plan view showing same manufacturing method.

Next, as shown in FIG. 15, end sections of the first charge accumulating layer 142a and the second charge accumulating layer 142b are oxidized. Due to this step, the first region 142a_1, the second region 142a_2, and the third region 142a_3 are formed in the first charge accumulating layer 142a. Moreover, the first region 142b_1, the second region 142b_2, and the third region 142b_3 are formed in the second charge accumulating layer 142b.

This step is performed by the likes of thermal oxidation, for example. An oxidation reaction proceeds from the trench AT. Hence, in the first charge accumulating layer 142a, the likes of aluminum oxide (AlO), aluminum oxynitride (AlON), aluminum silicon oxide (AlSiO), or aluminum silicon oxynitride (AlSiON) are formed in the first region 142a_1 and the second region 142a_2 provided in a vicinity of the trench AT. On the other hand, in the third region 142a_3 separated from the trench AT, the likes of aluminum nitride (AlN) or aluminum silicon nitride (AlSiN) remain without being oxidized. The same applies also to the second charge accumulating layer 142b.

Next, the sacrifice layers 170 are removed via the trenches AT, and upper surfaces and lower surfaces of the insulating layers 122 are exposed. This step is performed by a method such as wet etching, for example.

Figure 16:
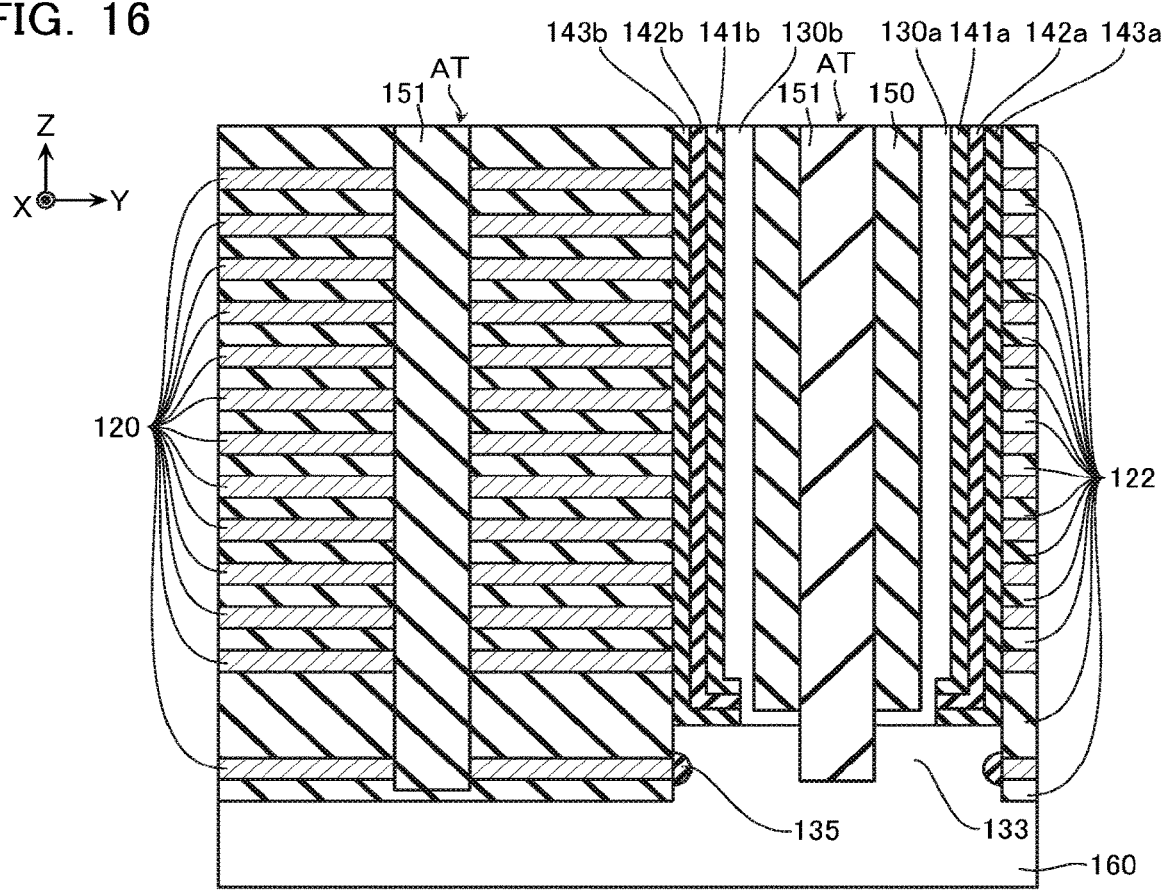
FIG. 16 is a schematic cross-sectional view showing same manufacturing method.

Next, as shown in FIG. 16, the insulating layer 135 is formed in a side surface of the semiconductor layer 133 by oxidation treatment, or the like. In addition, the conductive layers 120 are formed on the upper surfaces and the lower surfaces of the insulating layers 122. This step is performed by a method such as CVD, for example. Moreover, the insulating layer 151 is formed in the trench AT by CVD, or the like. As a result, a structure of the kind shown in FIG. 2 is formed.

[Advantages]

The semiconductor memory device according to the first embodiment is formed by, for example, forming a plurality of the memory holes MH aligned in the X direction as described with reference to FIGS. 5 and 6, forming the semiconductor section 130, and so on, in this memory hole MH as described with reference to FIG. 8, and so on, and forming the trench AT extending in the X direction as described with reference to FIGS. 13 and 14.

Such a structure makes it possible to form two electrically independent memory strings MSa, MSb in one memory hole MH, and makes it possible to provide a semiconductor memory device of large storage capacity.

However, in such a structure, a plurality of the corners 125 is formed in the conductive layer 120, as described with reference to FIG. 3. It is easy for an electric field to concentrate in such a corner 125, which sometimes causes a malfunction. For example, in the read operation, a channel of electrons is formed in an end section in the X direction of the first semiconductor layer 130a by the electric field from the corner 125, and a memory cell MC that should be read as OFF state is read as ON state, sometimes.

Now, in the present embodiment, regions of high oxygen concentration are provided in end sections in the X direction of the first charge accumulating layer 142a and the second charge accumulating layer 142b.

Now, the likes of aluminum oxide (AlO), aluminum oxynitride (AlON), aluminum silicon oxide (AlSiO), or aluminum silicon oxynitride (AlSiON) have a negative fixed charge. Hence, by providing end section regions of the first charge accumulating layer 142a and the second charge accumulating layer 142b with the likes of a material having such a negative fixed charge, it is possible to prevent the unintended channel of electrons to be formed in end sections in the X direction of the first semiconductor layer 130a and the second semiconductor layer 130b. This makes it possible to provide a semiconductor memory device that suppresses effects of a fringe electric field from the corner 125, and operates suitably.

Note that positions, ranges, and densities of charge of regions having negative fixed charge can be measured by using AFM (Atomic Force Microscopy). For example, by scanning a flat cross section of a semiconductor memory device with a cantilever while a voltage is applied to the cantilever, density of the negative fixed charge can be measured as electrostatic force between the device and the cantilever.

Second Embodiment

Next, a semiconductor memory device according to a second embodiment will be described with reference to FIGS. 17 and 18. Note that in the description below, portions similar to in the first embodiment will be assigned with the same symbols as in the first embodiment, and descriptions thereof will be omitted.

The memory cell array MA according to the present embodiment includes a plurality of laminated body structures LS' arranged in the Y direction via memory trenches MT. The laminated body structure LS' includes a plurality of conductive layers 220 laminated in the Z direction. Moreover, there are provided in each of the memory trenches MT: a plurality of semiconductor sections 230 arranged in the X direction via holes AH; gate insulating layers 240a, 240b provided between the laminated body structures LS' and the semiconductor section 230; and an insulating layer 250 of the likes of silicon oxide ($SiO_2$), provided in a central portion of the semiconductor section 230. An insulating layer 251 of the likes of silicon oxide ($SiO_2$) is embedded in the hole AH. Moreover, the wiring layer 160 is connected to a lower end of the semiconductor section 230.

The conductive layer 220 is basically configured similarly to the conductive layer 120 according to the first embodiment.

The semiconductor section 230 includes: a first semiconductor layer 230a and a second semiconductor layer 230b that are aligned in the Y direction via the insulating layer 250; and a semiconductor layer 233 connected to lower ends of these. These first semiconductor layer 230a, second semiconductor layer 230b, and semiconductor layer 233 are basically configured similarly to the first semiconductor layer 130a, second semiconductor layer 130b, and semiconductor layer 133 according to the first embodiment.

The gate insulating layer 240a includes: a first tunnel insulating layer 241a; a first charge accumulating layer 242a; and a first block insulating layer 243a. The gate insulating layer 240b includes: a second tunnel insulating layer 241b; a second charge accumulating layer 242b; and a second block insulating layer 243b. These are basically configured similarly to the first tunnel insulating layer 141a, first charge accumulating layer 142a, first block insulating layer 143a, the second tunnel insulating layer 141b, second charge accumulating layer 142b, and second block insulating layer 143b according to the first embodiment.

Figure 18:
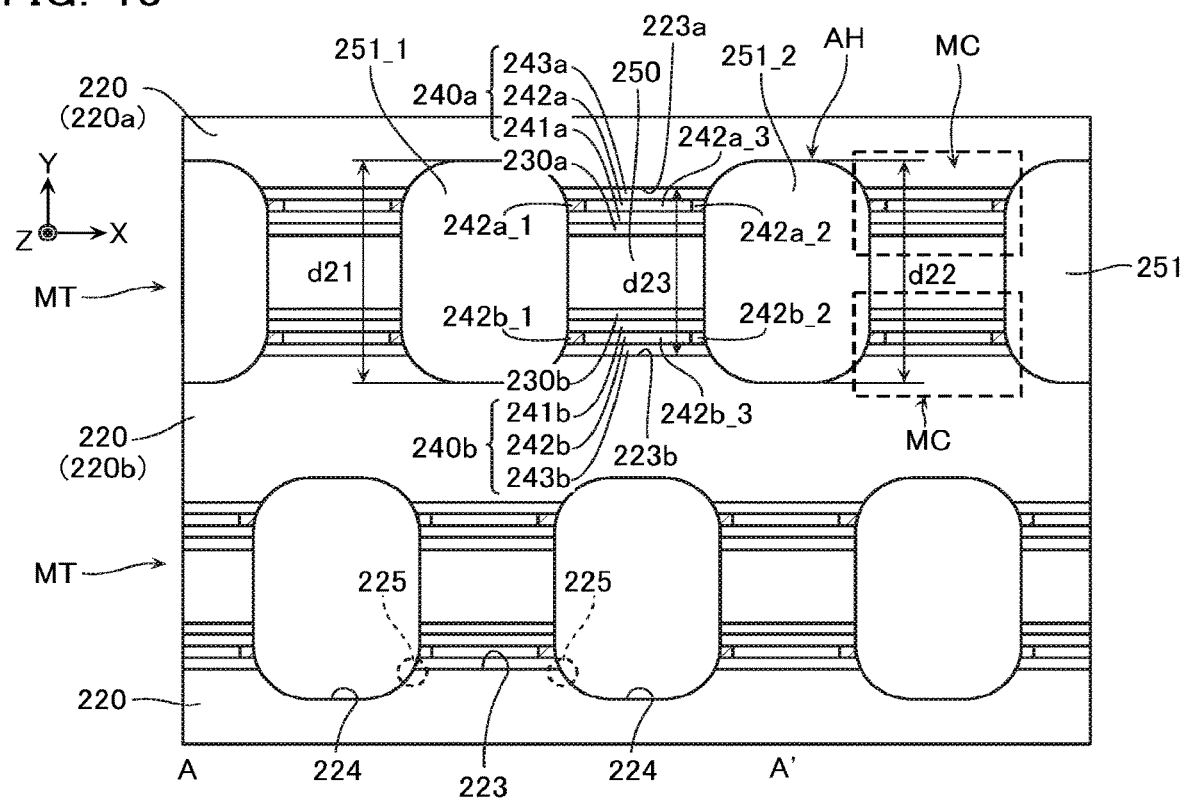
FIG. 18 is a schematic cross-sectional view corresponding to a cross section of the portion indicated by the line A-A' in FIG. 17.

However, as shown in FIG. 18, the conductive layers 220 includes, for example, facing surfaces 223 facing the first semiconductor layers 230a or the second semiconductor layers 230b. The facing surfaces 223 are formed linearly following a shape of the memory trench MT. On the other hand, the conductive layers 220 includes contacting surfaces 224 contacting the insulating layers 250 (a portion corresponding to the hole AH). The contacting surfaces are formed concavely following a shape of the hole AH. Moreover, connecting portion of the facing surface 223 and the contacting surface 224 is provided with a corner 225.

Moreover, the first semiconductor layer 230a, the second semiconductor layer 230b, and the gate insulating layers 240a, 240b each includes facing surfaces facing the facing surfaces 223 of the conductive layer 220. These facing surfaces are formed linearly following the shape of the memory trench MT. On the other hand, the first semiconductor layer 230a, the second semiconductor layer 230b, and the gate insulating layers 240a, 240b each includes contacting surfaces contacting the insulating layer 251. These contacting surfaces are formed concavely following a shape of the hole AH. Moreover, a connecting portion of the facing surfaces and contacting surfaces are provided with a corner.

Moreover, the first charge accumulating layer 242a of the gate insulating layer 240a according to the present embodiment includes: a first region 242a_1 provided at one end in the X direction; a second region 242a_2 provided at the other end in the X direction; and a third region 242a_3 provided between these in the X direction. The first region 242a_1 and the second region 242a_2 have different positions in the X direction from each other and contact the insulating layer 251. The first region 242a_1 and the second region 242a_2 are provided between the corners 225 of the conductive layer 220 and the corners of the first semiconductor layer 230a, respectively. The third region 242a_3 has a position in the X direction between the position in the X direction of the first region 242a_1 and the position in the X direction of the second region 242a_2. The first region 242a_1 and the second region 242a_2 include oxygen (O) and aluminum (Al). For example, the first region 242a_1 and the second region 242a_2 include the likes of aluminum oxide (AlO), aluminum oxynitride (AlON), aluminum silicon oxide (AlSiO), or aluminum silicon oxynitride (AlSiON). The third region 242a_3 includes nitrogen (N) and aluminum (Al). For example, the third region 242a_3 includes the likes of aluminum nitride (AlN) or aluminum silicon nitride (AlSiN). Concentrations of oxygen in the first region 242a_1 and the second region 242a_2 are higher than a concentration of oxygen in the third region 242a_3. The third region 242a_3 may, but need not, include oxygen. Note that range of the first region 242a_1, the second region 242a_2, and the third region 242a_3 in the first charge accumulating layer 242a can be freely determined.

Moreover, the second charge accumulating layer 242b of the gate insulating layer 240b according to the present embodiment includes: a first region 242b_1 provided at one end in the X direction; a second region 242b_2 provided at the other end in the X direction; and a third region 242b_3 provided between these in the X direction. The first region 242b_1 and the second region 242b_2 have different positions in the X direction from each other and contact the insulating layer 251. The first region 242b_1 and the second region 242b_2 are provided between the corners 225 of the conductive layer 220 and the corners of the second semiconductor layer 230b, respectively. The third region 242b_3 has a position in the X direction between the position in the X direction of the first region 242b_1 and the position in the X direction of the second region 242b_2. The first region 242b_1 and the second region 242b_2 include oxygen (O) and aluminum (Al). For example, the first region 242b_1 and the second region 242b_2 include the likes of aluminum oxide (AlO), aluminum oxynitride (AlON), aluminum silicon oxide (AlSiO), or aluminum silicon oxynitride (AlSiON). The third region 242b_3 includes nitrogen (N) and aluminum (Al). For example, the third region 242b_3 includes the likes of aluminum nitride (AlN) or aluminum silicon nitride (AlSiN). Concentrations of oxygen in the first region 242b_1 and the second region 242b_2 are higher than a concentration of oxygen in the third region 242b_3. The third region 242b_3 may, but need not, include oxygen. Note that range of the first region 242b_1, the second region 242b_2, and the third region 242b_3 in the second charge accumulating layer 242b can be freely determined.

Note that in FIG. 18, an insulating layer 251_1 and an insulating layer 2512 embedded in two memory holes MH aligned in the X direction is illustrated. Additionally, a length in the Y direction of the insulating layer 251_1 is shown as a length d21, and a length in the Y direction of the insulating layer 251_2 is shown as a length d22. Moreover, a distance in the Y direction between the facing surface 223a of the conductive layer 220a facing the first semiconductor layer 230a and the facing surface 223b of the conductive layer 220b facing the first semiconductor layer 230b is shown as a distance d23. In the illustrated example, the length d21 and the length d22 are substantially the same. On the other hand, the distance d23 is smaller than the lengths d21 and d22.

[Manufacturing Method]

Next, a manufacturing method of the semiconductor memory device according to the present embodiment will be described with reference to FIGS. 19-30.

In same manufacturing method, first, a step similar to the step described with reference to FIG. 4 will be performed.

Figure 17:
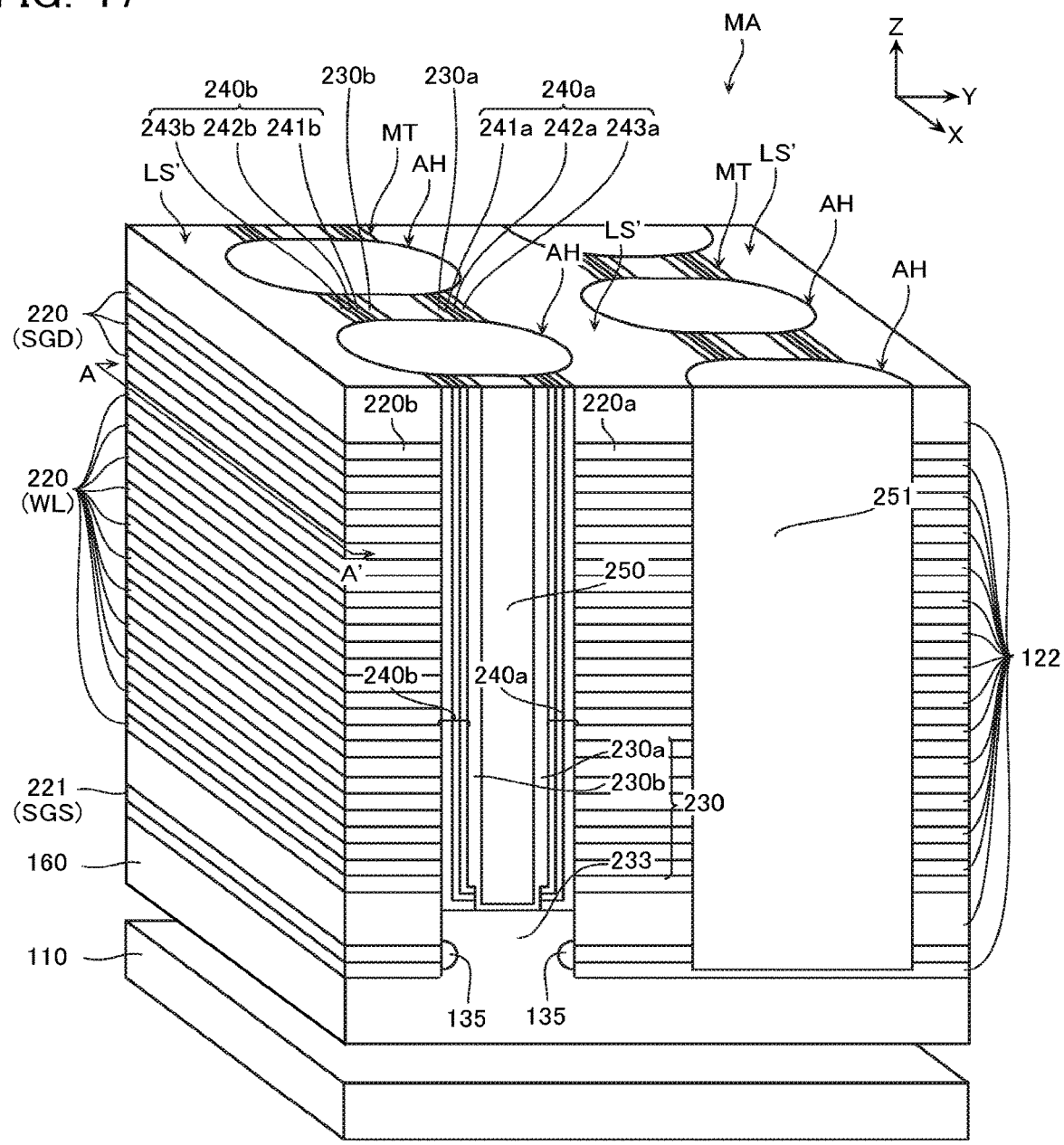
FIG. 17 is a schematic perspective view of a semiconductor memory device according to a second embodiment.
Figure 19:
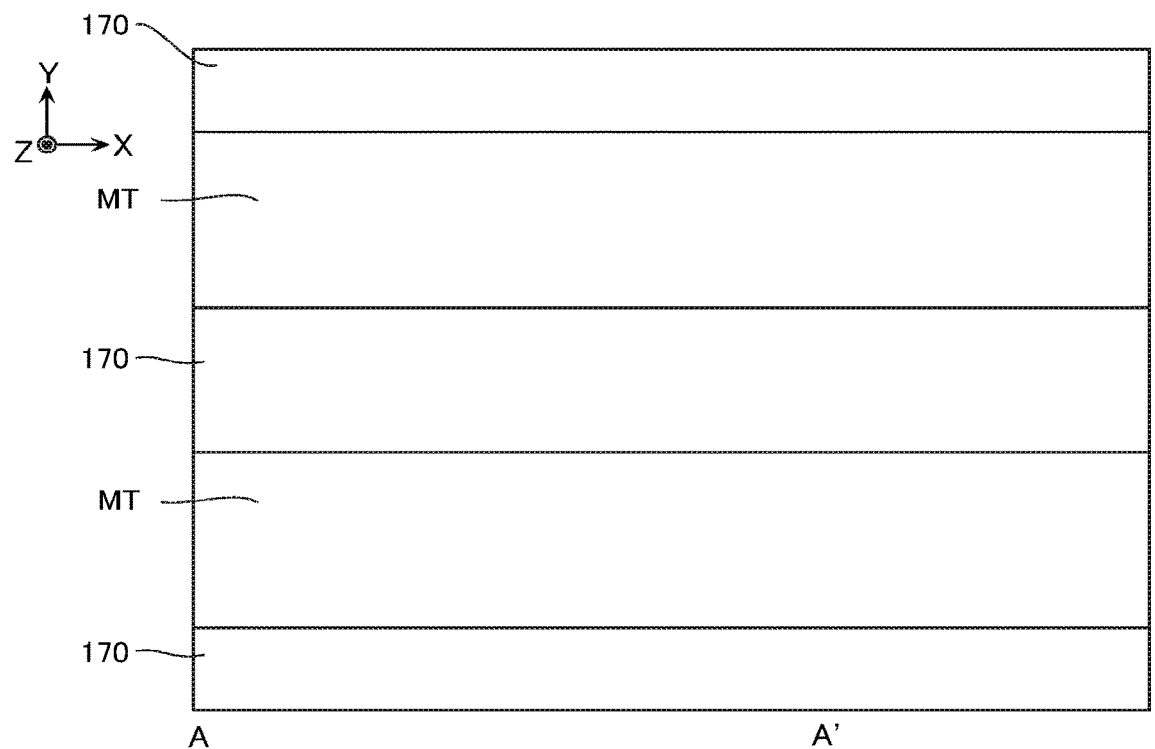
FIG. 19 is a schematic cross-sectional view showing a manufacturing method of the semiconductor memory device according to the second embodiment.
Figure 20:
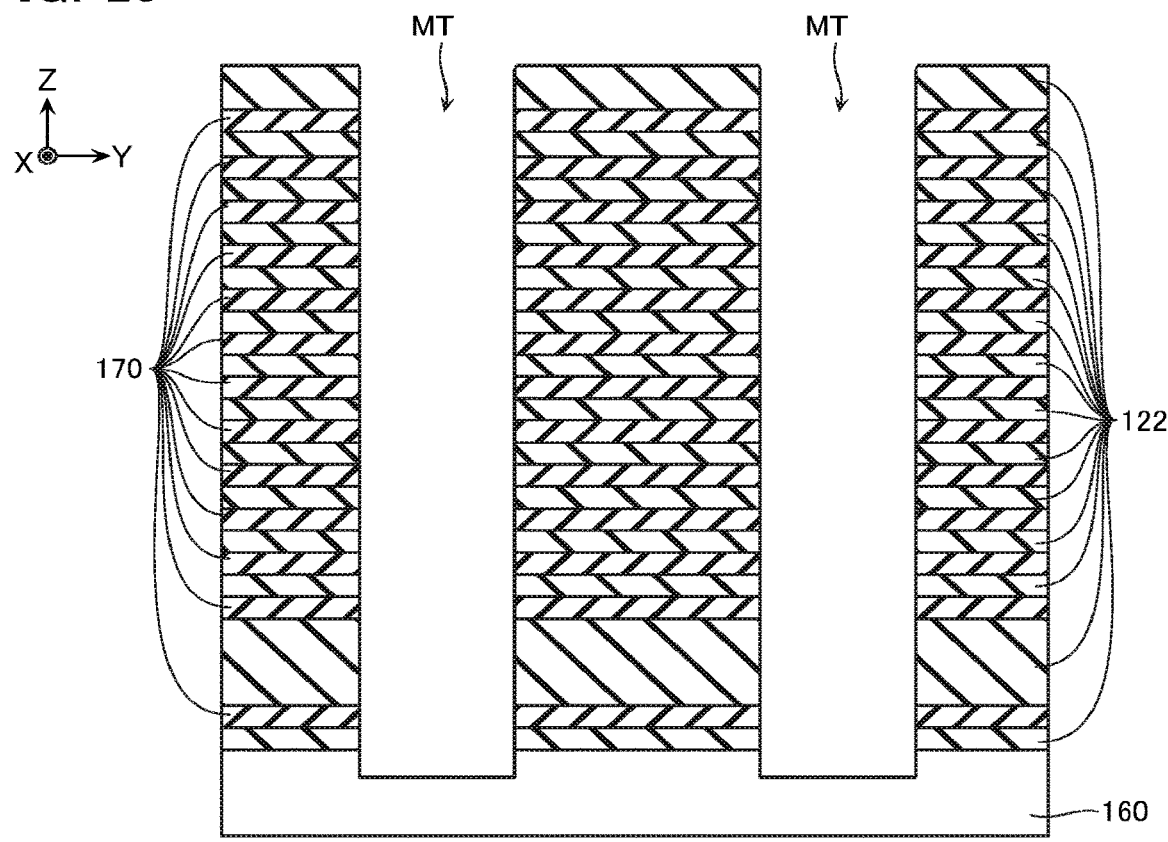
FIG. 20 is a schematic cross-sectional view showing same manufacturing method.

Next, as shown in FIG. 19 (an XY cross-sectional view corresponding to a cross section of the portion indicated by the line A-A' in FIG. 17) and FIG. 20, the memory trenches MT are formed in the insulating layers 122 and the sacrifice layers 170. The memory trenches MT are formed by, for example, forming on an upper surface of the structure shown in FIG. 4 an insulating layer having openings in portions corresponding to the memory trenches MT, and performing the likes of RIE with this insulating layer as a mask. The memory trench MT extends in the X direction. As shown in FIG. 20, the memory trench MT extends in the Z direction and penetrates the insulating layers 122 and sacrifice layers 170 to expose the upper surface of the wiring layer 160.

Figure 21:
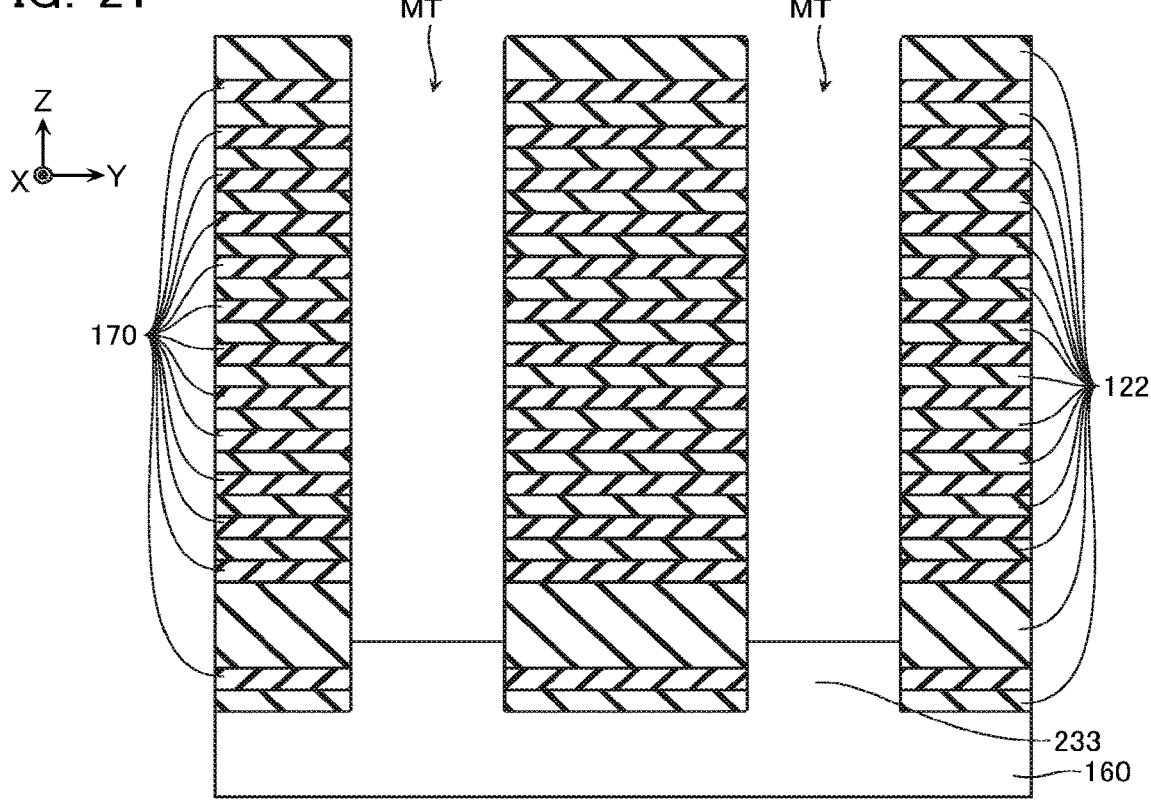
FIG. 21 is a schematic cross-sectional view showing same manufacturing method.

Next, as shown in FIG. 21, the semiconductor layer 233 is formed in a bottom section of the memory trench MT. The semiconductor layer 233 is formed by the likes of epitaxial growth, for example.

Figure 22:
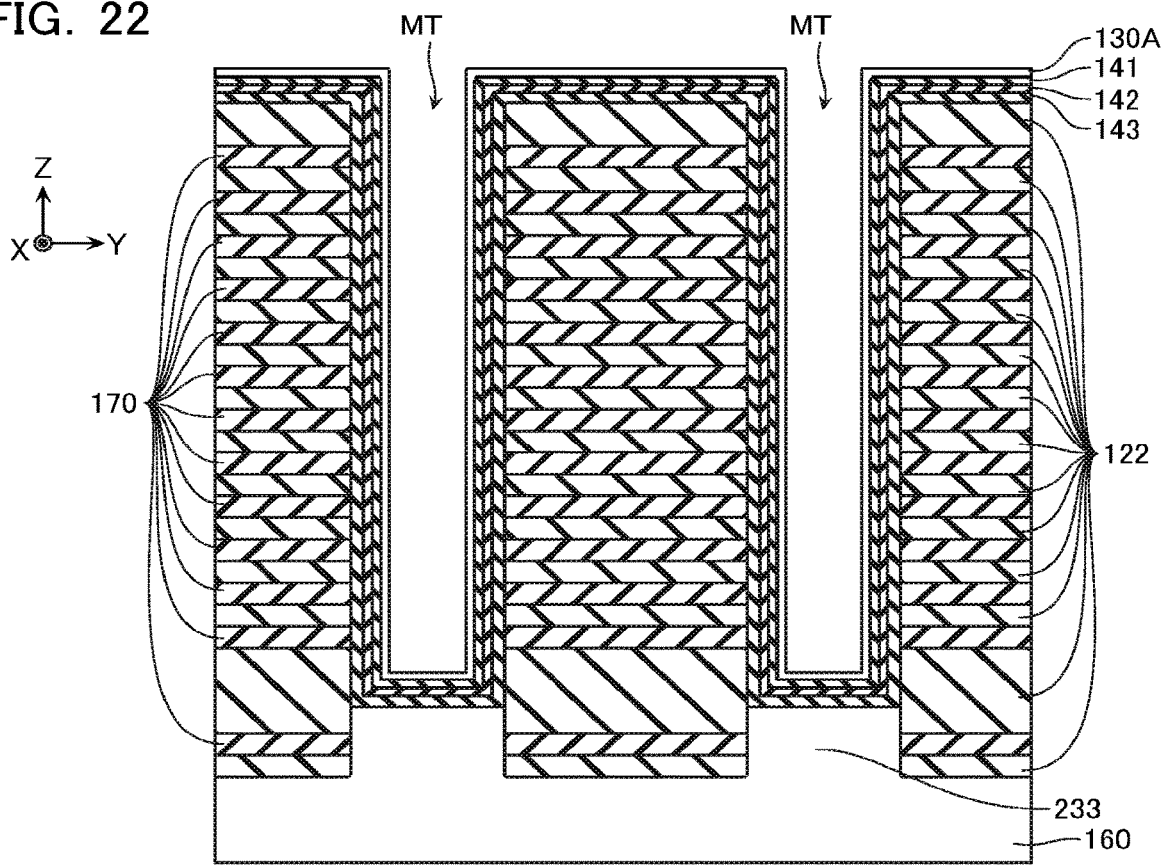
FIG. 22 is a schematic cross-sectional view showing same manufacturing method.

Next, as shown in FIG. 22, the block insulating layer 143, the charge accumulating layer 142, the tunnel insulating layer 141, and the amorphous silicon layer 130A are deposited on a bottom surface and side surfaces of the memory trench MT. This step is performed by a method such as CVD, for example.

Figure 23:
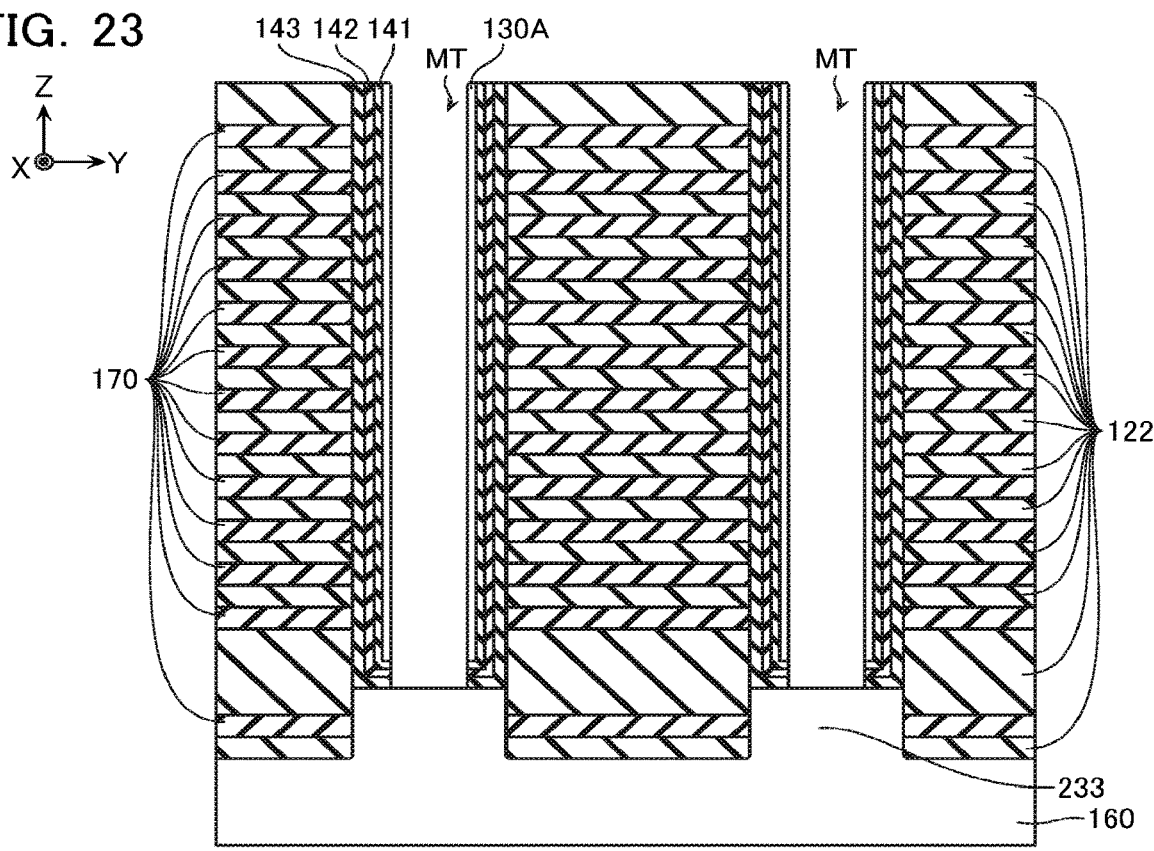
FIG. 23 is a schematic cross-sectional view showing same manufacturing method.

Next, as shown in FIG. 23, parts of the deposited layers (143, 142, 141, 130A) are removed to expose an upper surface of the semiconductor layer 233 and the upper surface of the insulating layer 122. This step is performed by the likes of RIE, for example.

Figure 24:
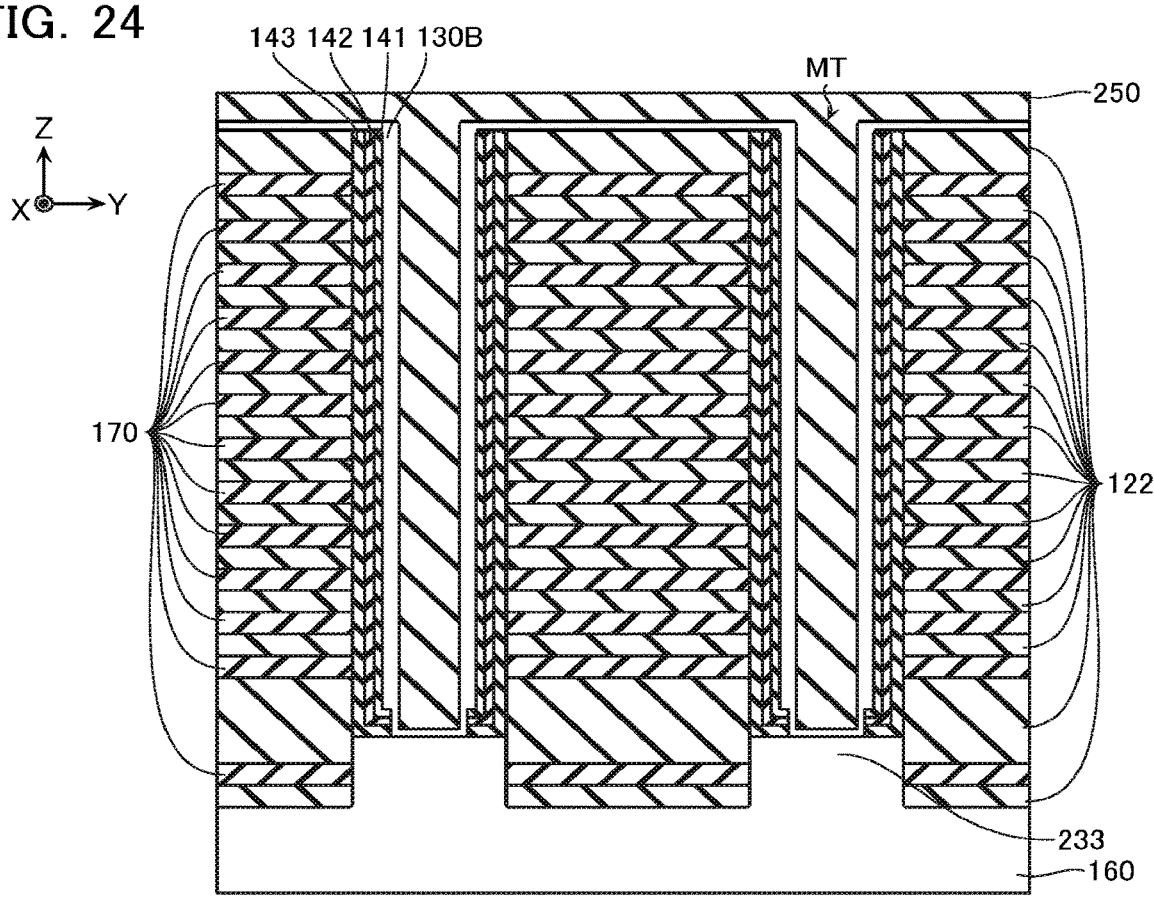
FIG. 24 is a schematic cross-sectional view showing same manufacturing method.

Next, as shown in FIG. 24, an amorphous silicon layer and the insulating layer 250 are deposited on an inside of the memory trench MT. In addition, heat treatment, and so on, is performed, and a crystal structure of the amorphous silicon layer is reformed to form the semiconductor layer 130B of the likes of polycrystalline silicon (Si).

Figure 25:
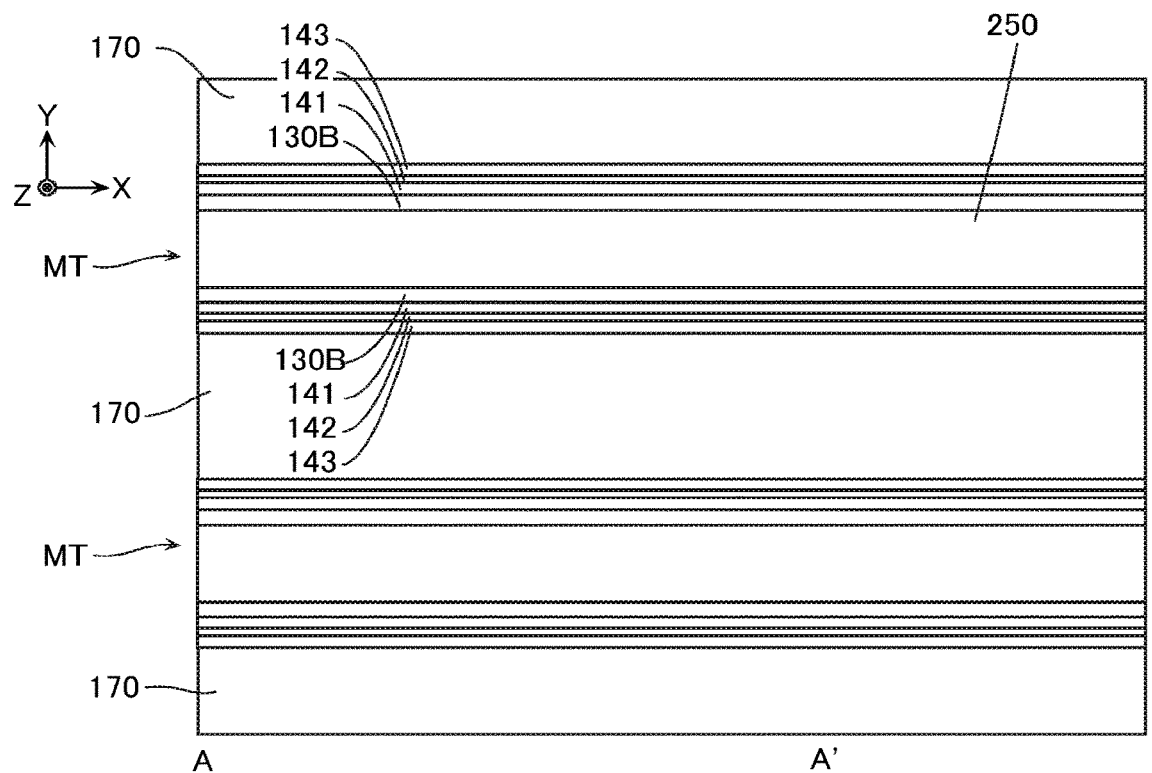
FIG. 25 is a schematic plan view showing same manufacturing method.
Figure 26:
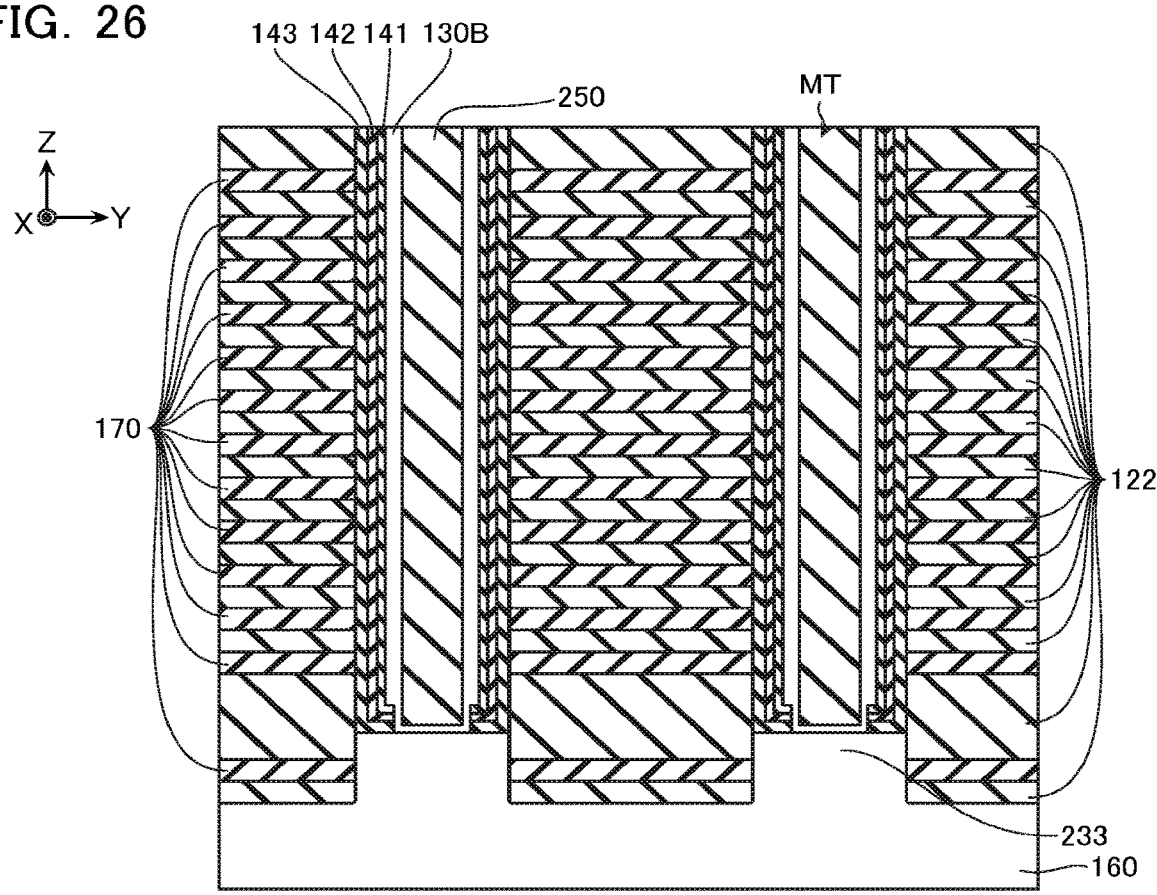
FIG. 26 is a schematic cross-sectional view showing same manufacturing method.

Next, as shown in FIGS. 25 and 26, upper sections of the insulating layer 250 and the semiconductor layer 130B are removed, and the upper surface of the insulating layer 122 is exposed to divide the semiconductor layer 130B into portions corresponding to the respective memory trenches MT.

Figure 27:
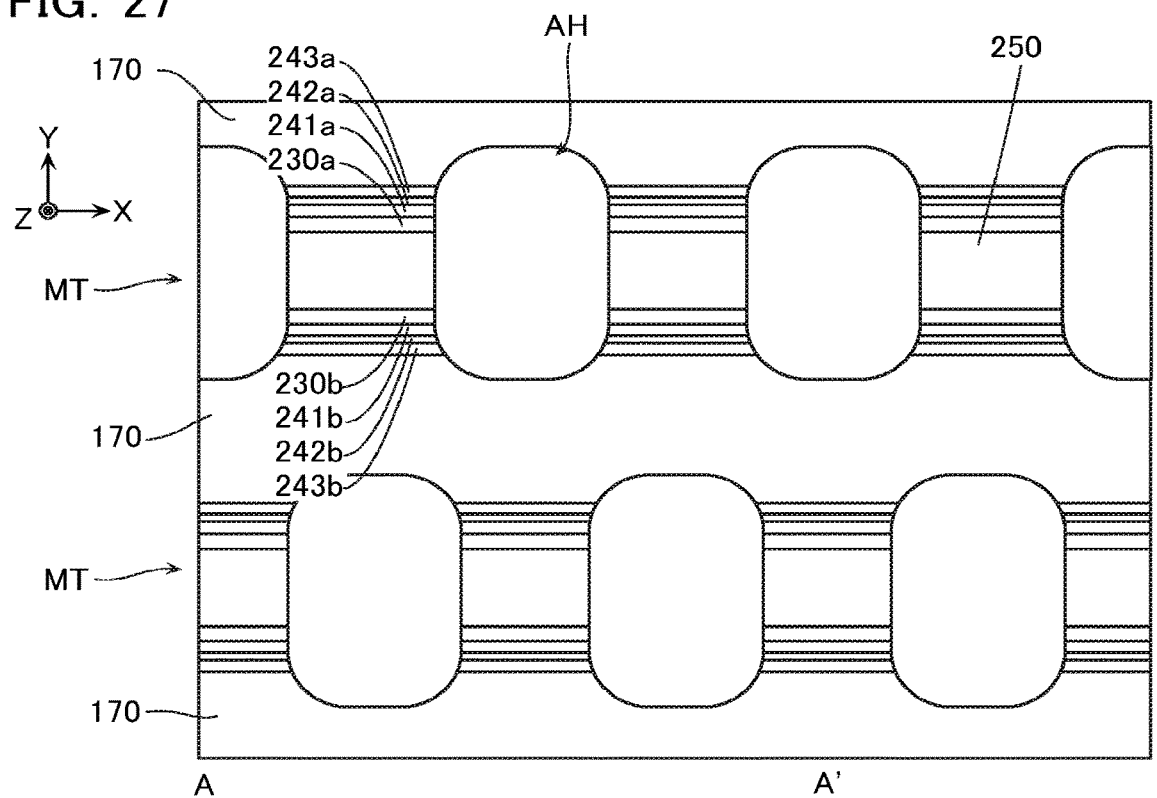
FIG. 27 is a schematic plan view showing same manufacturing method.
Figure 28:
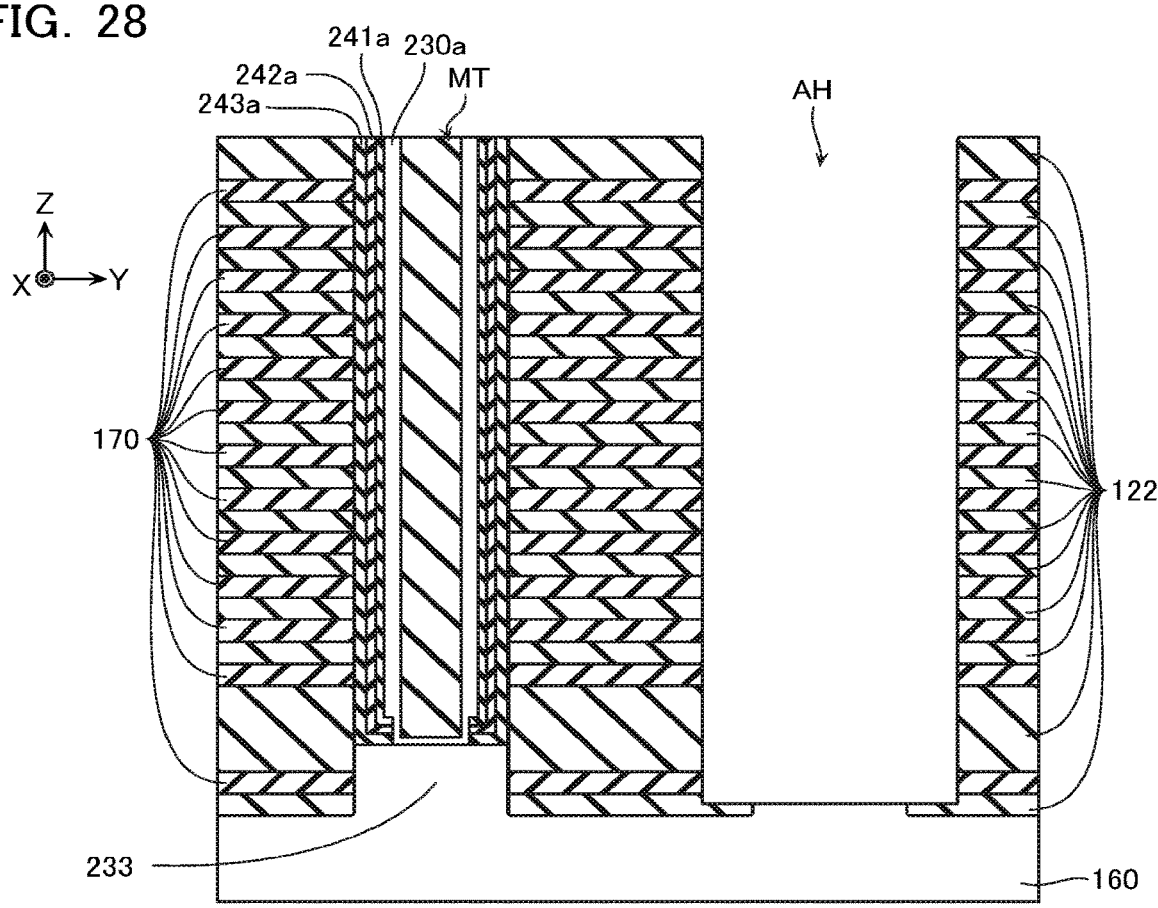
FIG. 28 is a schematic cross-sectional view showing same manufacturing method.

Next, as shown in FIGS. 27 and 28, the holes AH are formed. The holes AH are formed by, for example, forming on an upper surface of the structure shown in FIG. 26 an insulating layer having openings in portions corresponding to the holes AH, and performing the likes of RIE with this insulating layer as a mask. A shape in XY cross section of the hole AH may be substantially circular, or may be substantially oval, for example. As shown in FIG. 28, the hole AH extends in the Z direction and penetrates the layers (250, 130B, 141, 142, 143) in the memory trench MT to divide a structure in the memory trench MT in the X direction. This step is performed by the likes of RIE, for example.

Due to this step, the first semiconductor layer 230a and the second semiconductor layer 230b, the first tunnel insulating layer 241a and the second tunnel insulating layer 241b, the first charge accumulating layer 242a and the second charge accumulating layer 242b, and the first block insulating layer 243a and the second block insulating layer 243b are formed.

Figure 29:
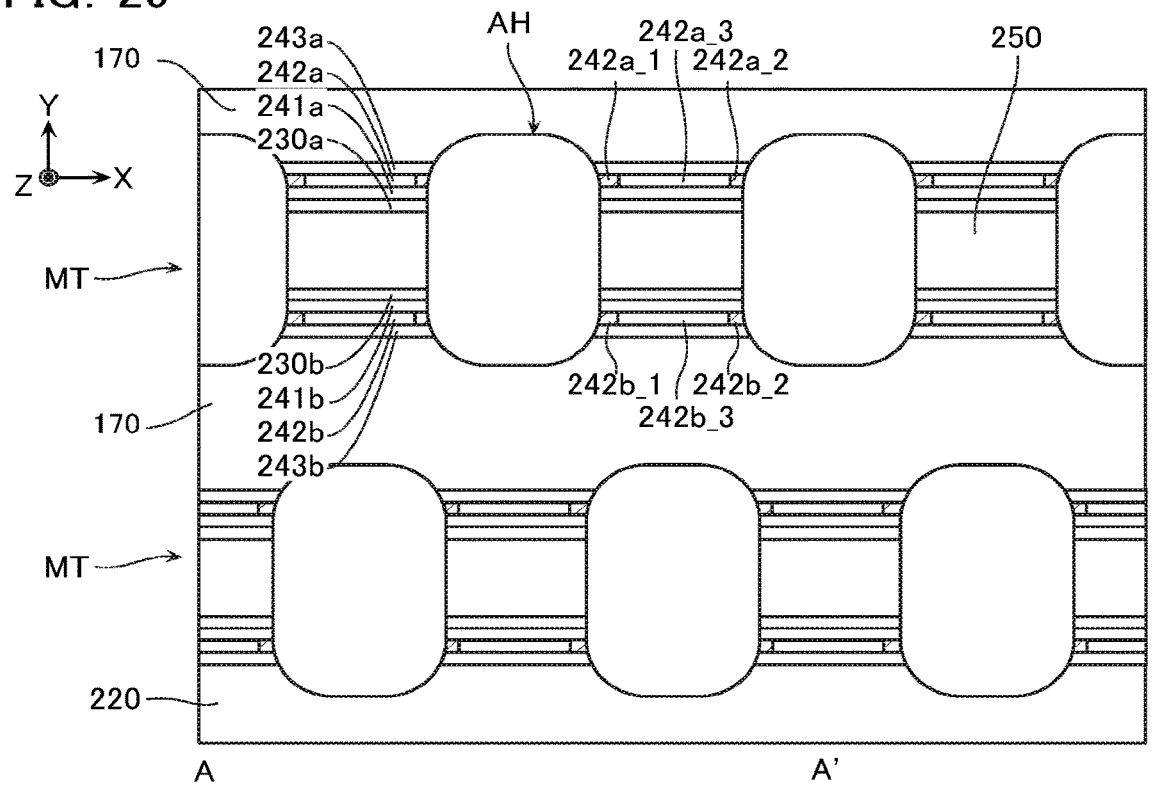
FIG. 29 is a schematic plan view showing same manufacturing method.

Next, as shown in FIG. 29, end sections of the first charge accumulating layer 242a and the second charge accumulating layer 242b are oxidized. Due to this step, the first region 242a_1, the second region 242a_2, and the third region 242a_3 are formed in the first charge accumulating layer 242a. Moreover, the first region 242b_1, the second region 242b_2, and the third region 242b_3 are formed in the second charge accumulating layer 242b.

This step is performed similarly to the step described with reference to FIG. 15, for example.

Next, the sacrifice layers 170 are removed via the holes AH, and upper surfaces and lower surfaces of the insulating layers 122 are exposed. This step is performed by a method such as wet etching, for example.

Figure 30:
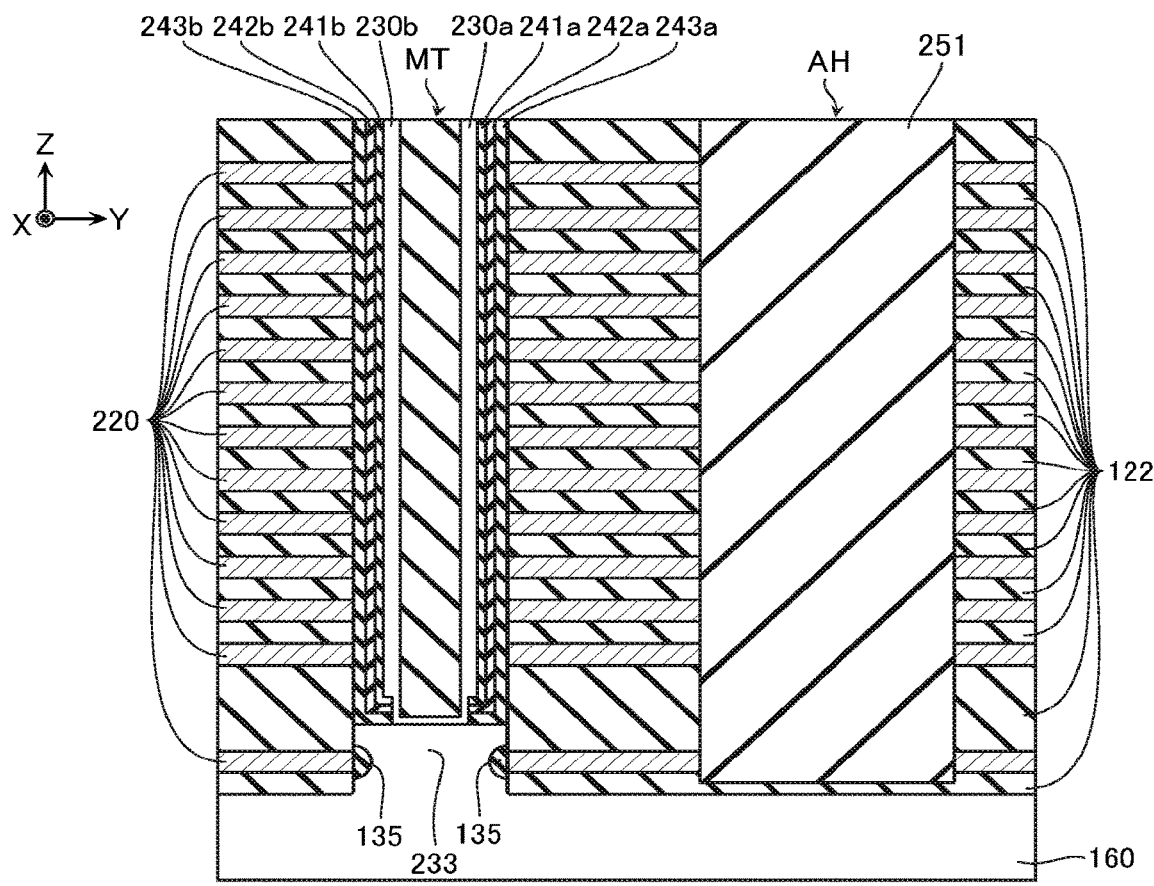
FIG. 30 is a schematic cross-sectional view showing same manufacturing method.

Next, as shown in FIG. 30, the insulating layer 135 is formed in a side surface of the semiconductor layer 233 by oxidation treatment, or the like. In addition, the conductive layers 220 are formed on the upper surfaces and the lower surfaces of the insulating layers 122. This step is performed by a method such as CVD, for example. Moreover, the insulating layer 251 is formed in the hole AH by CVD, or the like. As a result, a structure of the kind shown in FIG. 17 is formed.

Other Embodiments

That concludes exemplification of the semiconductor memory devices according to the first and second embodiments. However, the above configurations are merely exemplifications, and it is possible for specific configurations, and so on, to be appropriately adjusted.

For example, a single layer structure of the likes of aluminum nitride (AlN) or aluminum silicon nitride (AlSiN) was exemplified as the first charge accumulating layer 142a and the second charge accumulating layer 142b according to the first embodiment (FIG. 3), and as the first charge accumulating layer 242a and the second charge accumulating layer 242b according to the second embodiment (FIG. 18). However, a structure of the charge accumulating layer may be appropriately adjusted.

Figure 31:
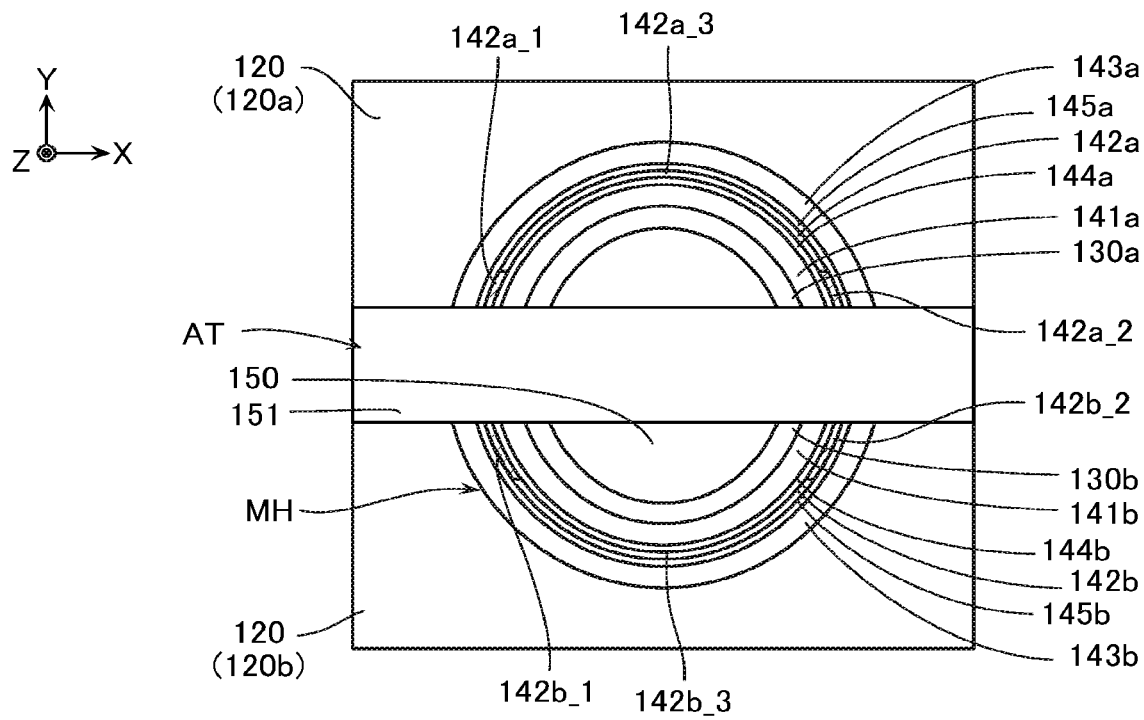
FIG. 31 is a schematic cross-sectional view showing a configuration of part of a first another example of a configuration according to the first embodiment.

FIG. 31 shows a first another example of the configuration according to the first embodiment. FIG. 31 is a schematic XY cross-sectional view exemplifying a configuration of part of a semiconductor memory device according to the first another example.

In the first another example, a charge accumulating layer 144a is provided between the first charge accumulating layer 142a and the first tunnel insulating layer 141a. In addition, a charge accumulating layer 145a is provided between the first charge accumulating layer 142a and the first block insulating layer 143a.

Moreover, in the first another example, a charge accumulating layer 144b is provided between the second charge accumulating layer 142b and the second tunnel insulating layer 141b. In addition, a charge accumulating layer 145b is provided between the second charge accumulating layer 142b and the second block insulating layer 143b.

The charge accumulating layers 144a, 144b, 145a, 145b are charge accumulating layers that include nitrogen (N), for example. The charge accumulating layers 144a, 144b, 145a, 145b include a nitride material of the likes of silicon nitride (SiN), hafnium nitride (HfN), or zirconium nitride (ZrN), for example.

Note that FIG. 31 exemplified a charge accumulating layer of three-layered structure configured from the charge accumulating layer 144a, the first charge accumulating layer 142a, and the charge accumulating layer 145a. However, a charge accumulating layer of two-layered structure may be adopted by omitting one of the charge accumulating layers 144a, 145a, for example. The same applies also to the second charge accumulating layer 142b.

Figure 32:
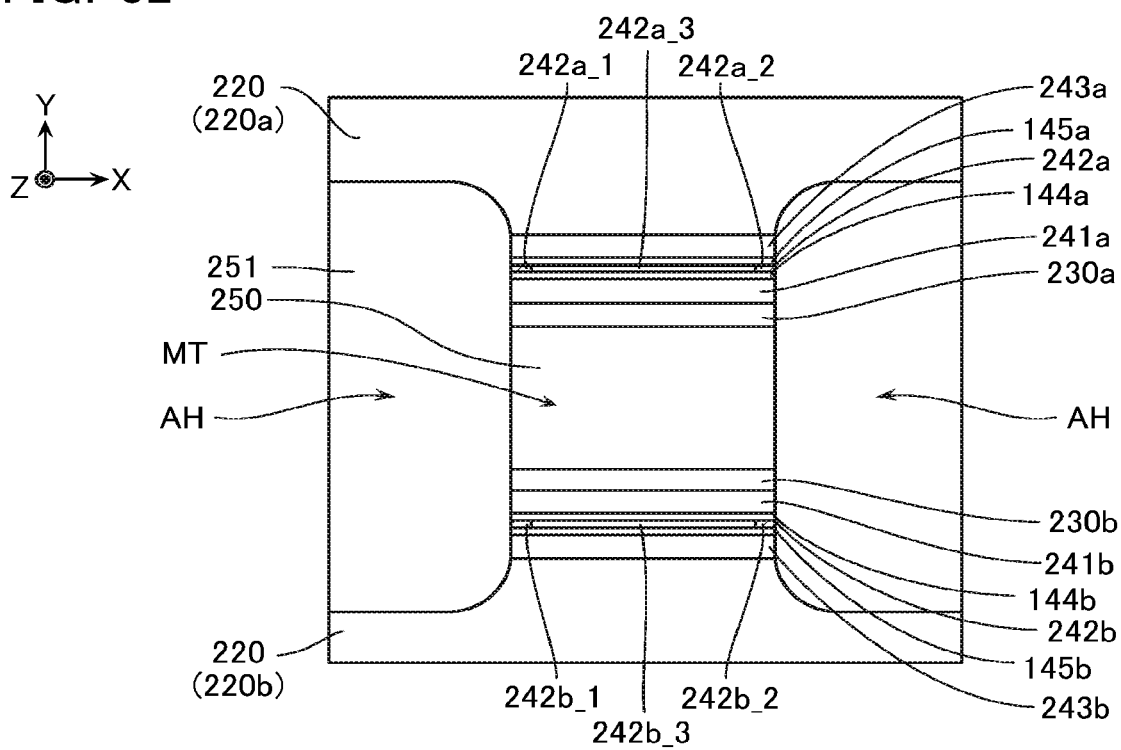
FIG. 32 is a schematic cross-sectional view showing a configuration of part of a first another example of a configuration according to the second embodiment.

Moreover, FIG. 31 showed an example where the charge accumulating layer has a laminated structure in the configuration according to the first embodiment. However, as shown in FIG. 32, for example, in the configuration according to the second embodiment too, the charge accumulating layer may have the above-mentioned kind of laminated structure.

Figure 33:
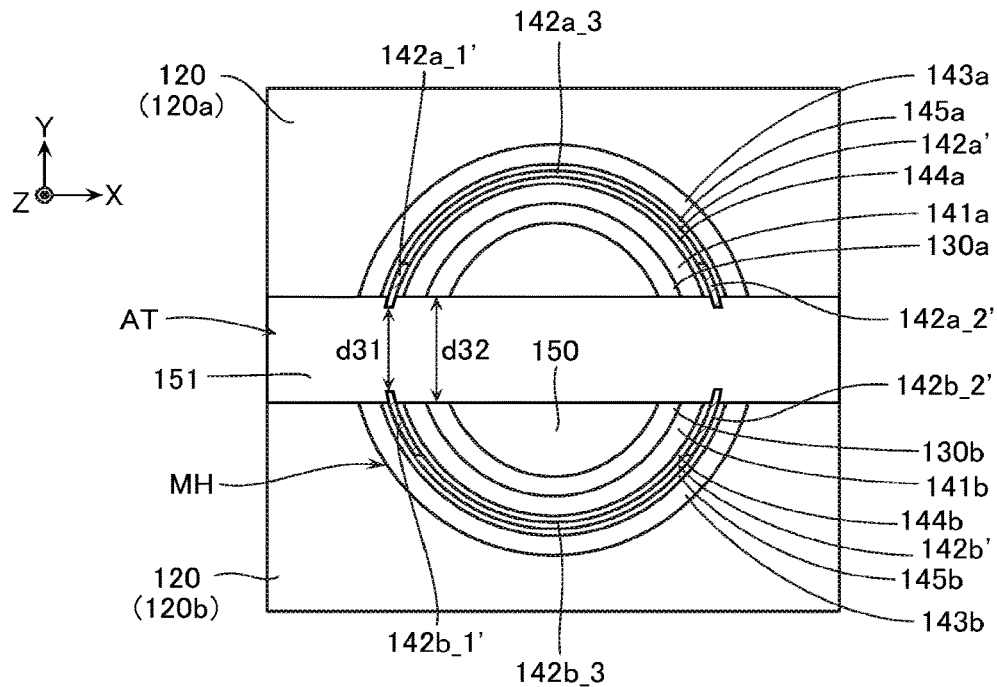
FIG. 33 is a schematic cross-sectional view showing a configuration of part of a second another example of the configuration according to the first embodiment.

FIG. 33 shows a second another example of the configuration according to the first embodiment. FIG. 33 is a schematic XY cross-sectional view exemplifying a configuration of part of a semiconductor memory device according to the second another example.

A first charge accumulating layer 142a' and a second charge accumulating layer 142b' according to the second another example are basically configured similarly to the first charge accumulating layer 142a and the second charge accumulating layer 142b according to the first embodiment. However, respective parts of configurations of the first regions 142a_1', 142b_1' and the second regions 142a_2', 142b_2', of the first charge accumulating layer 142a' and the second charge accumulating layer 142b' according to the second another example, differ from in the first embodiment.

The first charge accumulating layer 142a' and the second charge accumulating layer 142b' are basically configured similarly to in the first embodiment. However, the first charge accumulating layer 142a' and the second charge accumulating layer 142b' each have a structure projecting to a trench AT side.

In FIG. 33, a distance in the Y direction between the first region 142a_1' of the first charge accumulating layer 142a' and the first region 142b_1' of the second charge accumulating layer 142b' is shown as a distance d31. Additionally, a distance in the Y direction between the first semiconductor layer 130a and the second semiconductor layer 130b is shown as a distance d32. In the illustrated example, the distance d31 is smaller than the distance d32.

Note that FIG. 33 exemplified a charge accumulating layer of three-layered structure. However, one or both of the charge accumulating layers 144a, 145a may be omitted, or one or both of the charge accumulating layers 144b, 145b may be omitted, for example.

Moreover, FIG. 33 exemplified a structure where part of the charge accumulating layer projects to the trench AT side in the configuration according to the first embodiment. However, as shown in FIG. 34, for example, in the configuration according to the second embodiment too, the first region 242a_1' and the second region 242a_2' of the first charge accumulating layer 242a', and the first region 242b_1' and the second region 242b_2' of the second charge accumulating layer 242b' may project to a hole AH side.

Figure 34:
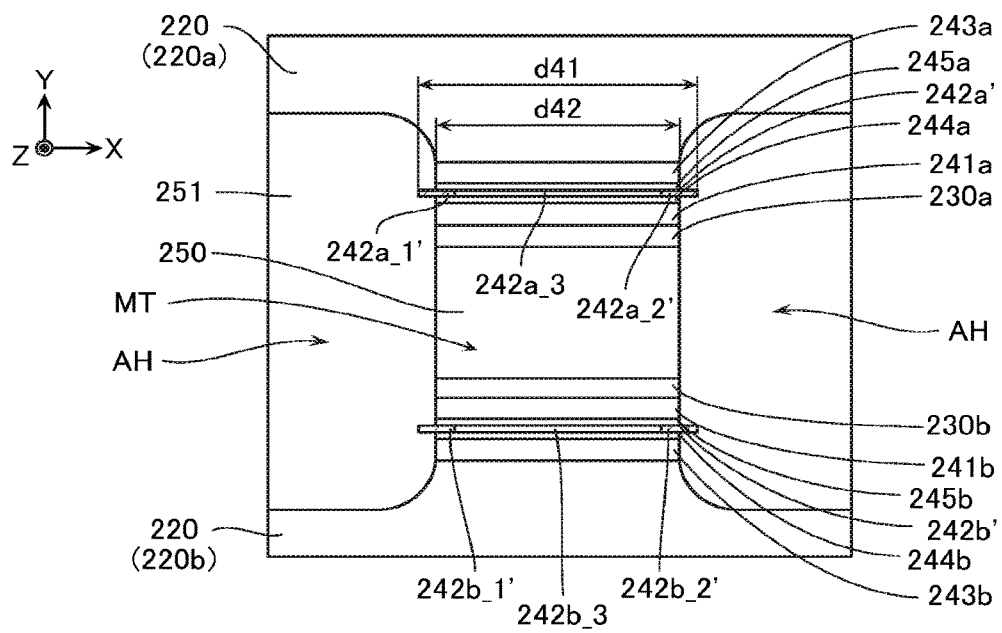
FIG. 34 is a schematic cross-sectional view showing a configuration of part of a second another example of the configuration according to the second embodiment.

Note that in FIG. 34, a length in the X direction of the first charge accumulating layer 242a' is shown as a length d41. Additionally, a length in the X direction of the first semiconductor layer 230a is shown as a length d42. In the illustrated example, the length d41 is larger than the length d42.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first electrode and a second electrode aligned in a first direction;
a first semiconductor layer provided between the first electrode and the second electrode, the first semiconductor layer facing the first electrode;
a second semiconductor layer provided between the first semiconductor layer and the second electrode, the second semiconductor layer facing the second electrode;
a first charge accumulating layer provided between the first electrode and the first semiconductor layer; and
a second charge accumulating layer provided between the second electrode and the second semiconductor layer,
at least one of the first charge accumulating layer and the second charge accumulating layer comprising:
a first region including aluminum and oxygen and having a first position as a position in a second direction, the second direction intersecting the first direction;
a second region including aluminum and oxygen and having a second position as a position in the second direction, the second position being different from the first position; and
a third region including aluminum and nitrogen and having a third position as a position in the second direction, the third position being between the first position and the second position, and
oxygen being not included in the third region or a concentration of oxygen in the third region being lower than concentrations of oxygen in the first region and the second region.

2. The semiconductor memory device according to claim 1, wherein
the first region and the second region include at least one of aluminum oxide (AlO), aluminum oxynitride (AlON), aluminum silicon oxide (AlSiO), and aluminum silicon oxynitride (AlSiON).

3. The semiconductor memory device according to claim 1, wherein
the third region includes at least one of aluminum nitride (AlN) and aluminum silicon nitride (AlSiN).

4. The semiconductor memory device according to claim 1, wherein the first region and the second region have negative fixed charge.

5. The semiconductor memory device according to claim 1, comprising:
a first insulating layer provided between the first charge accumulating layer and the first semiconductor layer; and
a third charge accumulating layer provided between the first charge accumulating layer and the first insulating layer and including nitrogen.

6. The semiconductor memory device according to claim 5, wherein
the third charge accumulating layer includes at least one of silicon nitride (SiN), hafnium nitride (HfN), and zirconium nitride (ZrN).

7. The semiconductor memory device according to claim 1, comprising:
a second insulating layer provided between the first charge accumulating layer and the first electrode; and
a fourth charge accumulating layer provided between the first charge accumulating layer and the second insulating layer and including nitrogen.

8. The semiconductor memory device according to claim 7, wherein the fourth charge accumulating layer includes at least one of silicon nitride (SiN), hafnium nitride (HfN), and zirconium nitride (ZrN).

9. The semiconductor memory device according to claim 1, wherein
the first charge accumulating layer and the second charge accumulating layer include the first region, the second region, and the third region respectively, and referring to a distance in the first direction between the first region of the first charge accumulating layer and the first region of the second charge accumulating layer as a first distance, referring to a distance in the first direction between the second region of the first charge accumulating layer and the second region of the second charge accumulating layer as a second distance, and referring to a distance in the first direction between the third region of the first charge accumulating layer and the third region of the second charge accumulating layer as a third distance, the first distance and the second distance are smaller than the third distance.

10. The semiconductor memory device according to claim 9, comprising:

the first electrode extending in the second direction;

the second electrode extending in the second direction;

a third insulating layer provided between the first electrode and the second electrode and extending in the second direction;

the first semiconductor layer provided between the first electrode and the third insulating layer; and the second semiconductor layer provided between the second electrode and the third insulating layer, wherein a surface of the third insulating layer on the first electrode side includes:

a first section and a second section aligned in the second direction and contacting the first electrode;

a third section provided between the first section and the second section and contacting the first semiconductor layer;

a fourth section provided between the first section and the third section and contacting the first region of the first charge accumulating layer; and a fifth section provided between the second section and the third section and contacting the second region of the first charge accumulating layer.

11. The semiconductor memory device according to claim 9, wherein referring to a distance in the first direction between the first region of the first charge accumulating layer and the first region of the second charge accumulating layer as a fourth distance, and referring to a distance in the first direction between the first semiconductor layer and the second semiconductor layer as a fifth distance, the fourth distance is smaller than the fifth distance.

12. The semiconductor memory device according to claim 1, comprising a fourth insulating layer and a fifth insulating layer provided between the first electrode and the second electrode and aligned in the second direction, wherein the first semiconductor layer and the second semiconductor layer are provided between the fourth insulating layer and the fifth insulating layer, referring to a length in the first direction of the fourth insulating layer as a first length, referring to a length in the first direction of the fifth insulating layer as a second length, and referring to a distance in the first direction between a facing surface of the first electrode facing the first semiconductor layer and a facing surface of the second electrode facing the second semiconductor layer as a sixth distance, the first length and the second length are larger than the sixth distance.

13. The semiconductor memory device according to claim 12, wherein the first charge accumulating layer and the second charge accumulating layer include the first region, the second region, and the third region respectively, and the fourth insulating layer contacts the first region of the first charge accumulating layer and the first region of the second charge accumulating layer, and the fifth insulating layer contacts the second region of the first charge accumulating layer and the second region of the second charge accumulating layer.

14. The semiconductor memory device according to claim 12, wherein referring to a length in the second direction of the first charge accumulating layer as a third length, and referring to a length in the second direction of the first semiconductor layer as a fourth length, the third length is larger than the fourth length.

* * * * *